(12) United States Patent
Kobatake

(10) Patent No.: US 8,446,163 B2
(45) Date of Patent: May 21, 2013

(54) TEST CIRCUIT AND TEST METHOD FOR TESTING DIFFERENTIAL INPUT CIRCUIT

(75) Inventor: Hiroyuki Kobatake, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 770 days.

(21) Appl. No.: 12/699,499

(22) Filed: Feb. 3, 2010

(65) Prior Publication Data

US 2010/0201394 A1 Aug. 12, 2010

(30) Foreign Application Priority Data

Feb. 10, 2009 (JP) .................................. 2009-028031

(51) Int. Cl.
*G01R 31/02* (2006.01)
*G01R 31/26* (2006.01)

(52) U.S. Cl.
USPC . 324/762.01; 324/527; 324/523; 324/762.09; 324/750.3; 324/762.02; 438/14; 714/733; 714/734

(58) Field of Classification Search .................. 324/527, 324/523, 762.01, 762.09, 750.3, 762.02; 438/14; 714/733–734
See application file for complete search history.

(56) References Cited

U.S. PATENT DOCUMENTS

| | | | | |
|---|---|---|---|---|
| 4,795,964 A * | 1/1989 | Mahant-Shetti et al. | ..... | 324/681 |
| 5,657,330 A * | 8/1997 | Matsumoto | .................... | 714/733 |
| 6,211,689 B1 * | 4/2001 | Oki | ........................... | 324/759.02 |
| 6,281,699 B1 * | 8/2001 | Bishop | ..................... | 324/750.01 |
| 6,498,508 B2 * | 12/2002 | Umeki | ....................... | 324/750.3 |
| 7,154,291 B2 * | 12/2006 | Turner | ..................... | 324/762.09 |
| 7,395,475 B2 * | 7/2008 | Do | ............................... | 714/734 |
| 7,439,754 B2 * | 10/2008 | Fujii | .......................... | 324/750.3 |
| 7,518,394 B1 * | 4/2009 | Chirania et al. | ................ | 326/16 |
| 7,521,937 B2 * | 4/2009 | Nagata | ........................... | 324/523 |
| 7,589,549 B2 * | 9/2009 | Kamo et al. | ................ | 324/750.3 |
| 7,649,373 B2 * | 1/2010 | Tokunaga | .................. | 324/750.3 |
| 7,750,659 B2 * | 7/2010 | Hayashi et al. | ............. | 324/750.3 |
| 7,849,373 B2 * | 12/2010 | Shin et al. | ..................... | 714/718 |
| 2001/0011905 A1 * | 8/2001 | Umeki | ........................ | 324/765 |
| 2002/0030505 A1 * | 3/2002 | Boettler et al. | ............... | 324/763 |
| 2003/0016044 A1 * | 1/2003 | Ishida et al. | .................. | 324/765 |
| 2003/0071648 A1 * | 4/2003 | Heijna et al. | .................. | 324/765 |
| 2004/0046575 A1 * | 3/2004 | Iwase | ............................ | 324/713 |
| 2006/0044003 A1 * | 3/2006 | Turner | ........................ | 324/769 |

(Continued)

FOREIGN PATENT DOCUMENTS

JP 1-263997 A 10/1989

OTHER PUBLICATIONS

Ionescu et al., "Non Inverting Differential Asymmetrical CMOS Comparator With Intrinsic Hysteresis and Adjustable Asymmetry", International Semiconductor Conference, 2007, pp. 555-558.*

*Primary Examiner* — Patrick Assouad
*Assistant Examiner* — Lamarr Brown
(74) *Attorney, Agent, or Firm* — Foley & Lardner LLP

(57) ABSTRACT

A test circuit includes a signal level modifying circuit. The signal level modifying circuit modifies at least one of signal levels of an inverting input signal and a noninverting input signal supplied to a differential input circuit in response to a test signal outputted from a signal output circuit to make a difference between signal levels of the inverting input signal and the noninverting input signal smaller than that in a normal operation. Here, the test signal indicates a test mode in which input/output characteristics of the differential input circuit is tested.

15 Claims, 23 Drawing Sheets

U.S. PATENT DOCUMENTS

| | | | |
|---|---|---|---|
| 2006/0220669 A1* | 10/2006 | Saitou et al. | 324/765 |
| 2006/0223201 A1* | 10/2006 | Liu et al. | 438/10 |
| 2006/0250153 A1* | 11/2006 | Colbeck | 324/769 |
| 2006/0267618 A1* | 11/2006 | Yuan et al. | 324/763 |
| 2006/0279310 A1* | 12/2006 | Walker et al. | 324/765 |
| 2007/0118784 A1* | 5/2007 | Fusumada et al. | 714/733 |
| 2007/0170946 A1* | 7/2007 | Kato et al. | 324/769 |
| 2007/0205755 A1* | 9/2007 | Fujieda | 324/158.1 |
| 2007/0252583 A1* | 11/2007 | Hokoiwa et al. | 324/158.1 |
| 2007/0257353 A1* | 11/2007 | Park | 257/690 |
| 2007/0268022 A1* | 11/2007 | Nagata | 324/527 |
| 2008/0059102 A1* | 3/2008 | Frankowsky et al. | 702/117 |
| 2008/0093597 A1* | 4/2008 | Kiyota | 257/48 |
| 2008/0143371 A1* | 6/2008 | Mochida | 324/763 |
| 2009/0096476 A1* | 4/2009 | Koyama | 324/763 |
| 2009/0128181 A1* | 5/2009 | Kamo et al. | 324/765 |
| 2010/0253382 A1* | 10/2010 | Wang et al. | 324/771 |

* cited by examiner

11: VOLTAGE COMPARATOR CIRCUIT

12: CURRENT COMPARATOR CIRCUIT

Fig. 17
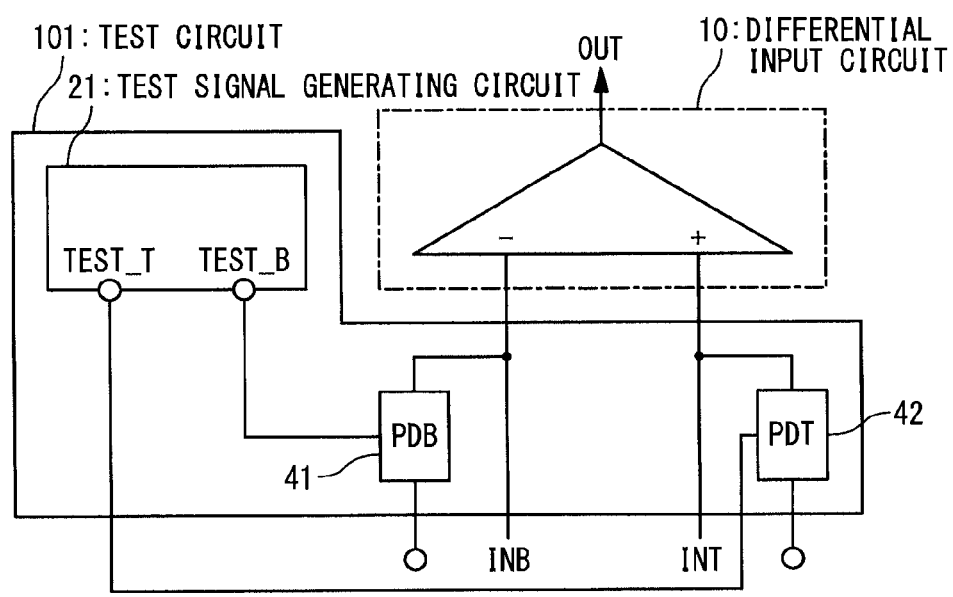
Fig. 18A    Fig. 18B
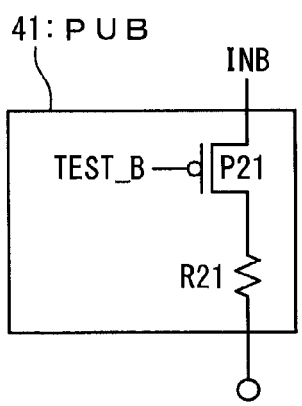    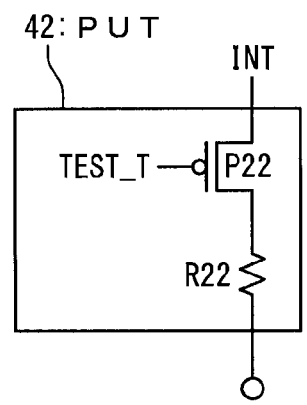

Fig. 26
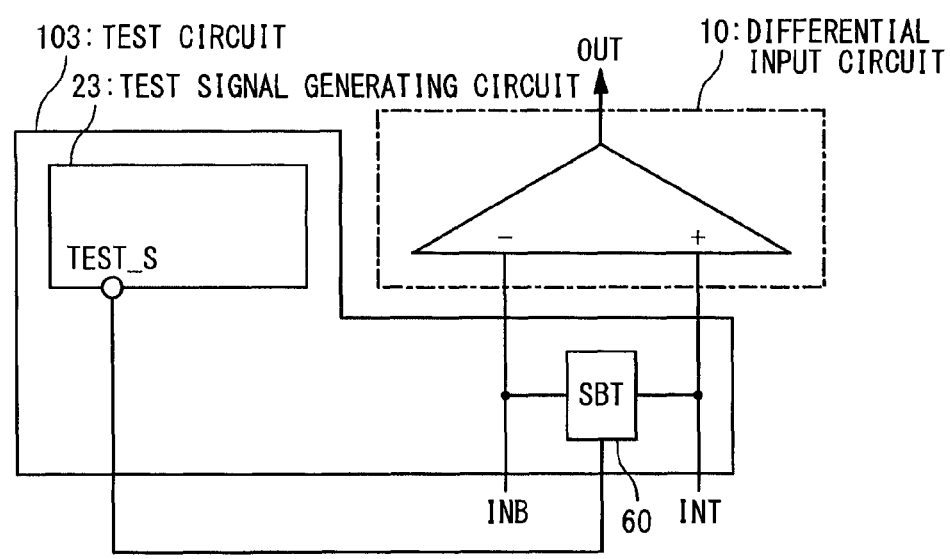
Fig. 27A  Fig. 27B
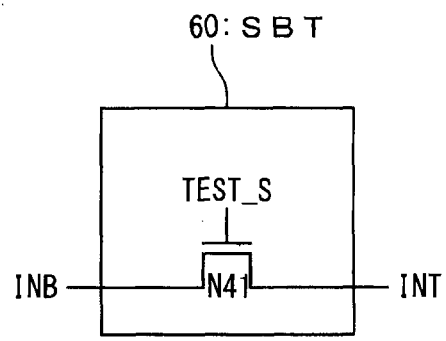 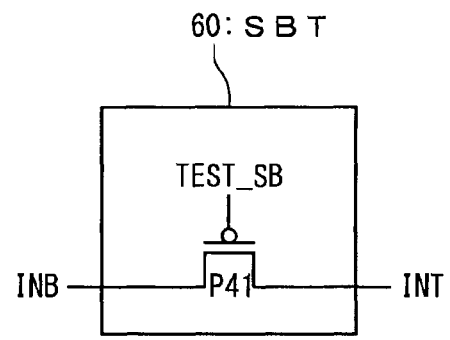

TEST CIRCUIT AND TEST METHOD FOR TESTING DIFFERENTIAL INPUT CIRCUIT

INCORPORATION BY REFERENCE

This application is based upon and claims the benefit of priority from Japanese patent application No. 2009-028031 filed on Feb. 10, 2009, the disclosure of which is incorporated herein in its entirety by reference.

BACKGROUND OF THE INVENTION

1. Field of the Invention

The present invention relates to a test circuit for a differential input circuit, and a test method for a differential input circuit.

2. Description of Related Art

To achieve the increases in operational speed and stability (to ensure an operational margin) in a semiconductor device, a differential input circuit 10 is utilized in which an output is determined by a difference between two input voltages (input differential voltage) or a difference between two input currents (input differential current). FIG. 1 is a diagram illustrating a symbol of the differential input circuit 10. The differential input circuit 10 outputs an output signal OUT corresponding to a potential difference or a current difference between a noninverting input signal INT and an inverting input signal INB that are in a complementary (reverse phase) relationship with each other. In the following, when the noninverting input signal INT and the inverting input signal INB are collectively referred, they are referred to as differential input signals INT and INB.

FIGS. 2 and 3 are circuit configuration diagrams respectively illustrating examples of the differential input circuit 10. FIG. 2 illustrates an example of a voltage comparator circuit 11 that outputs an output signal OUT corresponding to an input differential voltage. FIG. 3 illustrates an example of a current comparator circuit 12 that outputs an output signal OUT corresponding to an input differential current.

Referring to FIG. 2, the voltage comparator circuit 11 is a general differential amplifier circuit having an N-channel input stage. Specifically, the voltage comparator circuit 11 includes: N-channel MOS transistors N1 and N2 that form the input stage; P-channel MOS transistors P1 and P2 that form an active load; and an N-channel MOS transistor N3 that forms a current source. The P-channel MOS transistors and the N-channel MOS transistors are hereinafter respectively referred to as PMOS transistors and NMOS transistors. The NMOS transistor N3 supplies to sources of the NMOS transistors N1 and N2 a current corresponding to a bias voltage Vb supplied to a gate thereof. Differential input signals INB and INT are respectively inputted to gates of the NMOS transistors N1 and N2. The output signal OUT is outputted from a drain connected in common with the PMOS transistor P1 and the NMOS transistor N2.

Referring to FIG. 3, the current comparator circuit 12 includes: PMOS transistors P3 and P4 that form a first current mirror inputted with an input signal INT; an NMOS transistor N4 connected to a drain of the PMOS transistor P4 at a drain thereof; PMOS transistors P5 and P6 that form a second current mirror inputted with an input signal INB; and an NMOS transistor N5 connected to a drain of the PMOS transistor P5 at a drain thereof. The noninverting input signal INT is inputted to the PMOS transistor P3, and the inverting input signal INB is inputted to the PMOS transistor P6. The output signal OUT is outputted from a drain connected in common with the PMOS transistor P4 and the NMOS transistor N4.

Referring to FIGS. 4 to 6, input/output characteristics of the differential input circuit 10 are described. FIG. 4 is a diagram illustrating the input/output characteristics for the case where the normal differential input signals INT and INB are inputted to the normal voltage comparator circuit 11. FIG. 5 is a diagram illustrating the input/output characteristics that takes into account an input voltage offset in the voltage comparator circuit 11. FIG. 6 is a diagram illustrating the input/output characteristics that takes into account an input current offset in the current comparator circuit 12.

Referring to FIGS. 4 and 5, the input/output characteristics of the voltage comparator circuit 11 are described in the case where the differential input signals INT and INB having normal signal levels are inputted. The description below is provided on the assumption that an absolute value of a difference in voltage between the noninverting input signal INT and the inverting input signal INB is defined as an input differential voltage Vd1. Referring to FIG. 4, the voltage comparator circuit 11 outputs a high level output signal OUT when a voltage level of the noninverting input signal INT is higher than that of the inverting input signal INB, and the input differential voltage is Vd1 (time T1 to T2). Also, the voltage comparator circuit 11 outputs a low level output signal OUT when the voltage level of the noninverting input signal INT is lower than that of the inverting input signal INB, and the input differential voltage is Vd1 (before the time T1 and after the time T2).

In general, in the differential input circuit 10, an input offset due to a variation in element or the like may occur. For example, in the voltage comparator circuit 11, an input voltage offset Voff in the range of ±Voff occurs. Given that the absolute value of the input voltage offset is denoted by Voff, an effective input differential voltage in the voltage comparator circuit 11 takes a value (Vd1−Voff) obtained by subtracting the input voltage offset Voff from the input differential voltage Vd1. For this reason, the voltage comparator circuit 11 in which the input voltage offset Voff occurs determines a signal level (voltage) of the output signal OUT based on the effective input differential voltage (Vd1−Voff).

Specifically, the voltage comparator circuit 11 outputs the high level output signal OUT when the voltage level of the noninverting input signal INT is higher than that of the inverting input signal INB, and the effective input differential voltage is (Vd1−Voff), and outputs the low level output signal OUT when the voltage level of the noninverting input signal INT is lower than that of the inverting input signal INB, and the effective input differential voltage is (Vd1−Voff).

Similarly in the current comparator circuit 12, an input current offset Ioff in the range of ±Ioff as illustrated in FIG. 6 occurs due to a variation in element or the like. In this case, an effective input differential current in the current comparator circuit 12 takes a value (Id1−Ioff) obtained by subtracting the input current offset Ioff from an input differential current Id1. Note that we here define an absolute value of a current difference (INT−INB) between the noninverting input signal INT and the inverting input signal INB as the input differential current Id1, and an absolute value of the input current offset as Ioff. The current comparator circuit 12 outputs a high level output signal OUT when a current level of the noninverting input signal INT is higher than that of the inverting input signal INB, and the effective input differential current is (Id1−Ioff), and outputs a low level output signal OUT when the current level of the noninverting input signal INT is lower than that of the inverting input signal INB, and the effective input differential current is (Vd1−Voff).

The differential input circuit as described above is, for example, as described in Japanese Patent Publication No.

Heisei 01-263997A1, preferably used as an amplifier that drives a bit line pair connected to a memory (Patent document 1). In a differential amplifier described in Patent document 1, one of differential inputs is pulled up by a memory cell in a non-writing state, and then data is read from the other one of the differential inputs. As described, the one of the differential inputs is pulled up, and therefore a criterion for level comparison of a potential of the data upon verification is strict.

We have now discovered the following facts. In the case of occurrence of the input voltage offset Voff, even if the input differential voltage Vd1 between the differential input signals INT and INB has a normal value, the effective input differential voltage is decreased to (Vd1−Voff), and therefore an operational margin of the voltage comparator circuit 11 is decreased, resulting in instability. Specifically, if the effective input differential voltage is positive (Vd1−Voff>0), the effective signal levels of the differential input signals determining the signal level of the output signal OUT are not inverted. In this case, the output signal OUT exhibits a same signal level as that for the case of absence of the input voltage offset Voff. On the other hand, if the effective input differential voltage is negative (Vd1−Voff<0), the effective signal levels of the differential input signals determining the signal level of the output signal OUT are inverted. In this case, the output signal OUT transits to a level corresponding to the inverted signal level for the case of absence of the input voltage offset Voff. For example, the high-level output signal OUT should have been outputted based on the inputted differential input signals INT and INB; however, if the input voltage offset Voff is larger than the input differential voltage Vd1, the voltage comparator circuit 11 outputs the inverted low level output signal OUT.

Also, if there is no disturbance such as noise to the differential input signals INT and INB, the voltage comparator circuit 11 exhibits the input/output characteristics as illustrated in FIG. 4, whereas if there is the disturbance such as noise, the input differential voltage between the differential input signals INT and INB will be (Vd1−Vn) (Vn is an absolute value of noise voltage) as illustrated in FIG. 7. At this time, the effective input differential voltage taking into account the input voltage offset Voff is (Vd1−Vn−Voff).

Referring to FIGS. 7 to 10, the input/output characteristics are described in the case where noise or the like is mixed into the differential input circuit 10. The description is provided as an example using the voltage comparator 11 as the differential input circuit 10. FIG. 7 is a diagram illustrating the input/output characteristics of the normal differential input circuit 10 that outputs an expected value even if noise having an allowable level is mixed. FIG. 8 is a diagram illustrating the input/output characteristics of the differential input circuit 10 that outputs a signal different from the expected value if the noise having the allowable level is mixed.

As illustrated in FIGS. 7 and 8, during a time period (time T1 to T2) in which the high-level output signal OUT is outputted, in the case where the noise is inputted to the inverting input signal INB, an input differential voltage at a position of occurrence of the noise will be (Vd1−Vn). At this time, the effective input differential voltage is (Vd1−Vn−Voff). In the case where there occurs no input voltage offset Voff, or if the input voltage offset Voff is smaller than (Vd−Vn) as illustrated in FIG. 7, (Vd1−Vn−Voff)>0, and therefore the output signal OUT keeps the normal value (high-level in this case).

On the other hand, referring to FIG. 8, even in the case where the noise has the same level (Vn) as that described above, if the input voltage offset Voff is larger than (Vd1−Vn), the effective input differential voltage will fall below 0. That is, (Vd1−Vn−Voff)<0, and the signal level (high level) of the output signal OUT is inverted down to a low level. As described, the differential input circuit 10 in which the input offset occurs is an unstable circuit that has a small operational margin and is susceptible to noise.

Also, due to a malfunction or the like of a circuit that generates the differential input signals INT and INB, the input differential voltage Vd1 may be decreased. FIG. 9 is a diagram illustrating the input/output characteristics of the normal differential input circuit for the case where the differential input signals exhibiting abnormal values within an allowable range are inputted. Referring to FIG. 9, the effective input differential voltage (Vd1−Voff) of the voltage comparator circuit 11 in which the input voltage offset Voff occurs is further decreased. For this reason, as compared with the case where the normal differential input signals INT and INB are inputted, the voltage comparator circuit 11 is brought into a further operationally unstable state. However, if (Vd1−Voff)>0, the output signal OUT having the normal value (high level in this case) is outputted.

On the other hand, as illustrated in FIG. 10, if the input differential voltage Vd1 is small, the noise voltage Vn may exceed the input differential voltage Vd1. FIG. 10 is a diagram illustrating the input/output characteristics of the differential input circuit that outputs a signal different from the expected value upon input of the differential input signals exhibiting the abnormal values within the allowable range. Referring to FIG. 10, for example, if the noise is mixed into an inverting signal INB, the effective differential voltage (Vd1−Vn) will fall to or below 0. That is, the voltage levels of the noninverting signal INT and the inverting signal INB are inverted, and therefore the output signal OUT is inverted from the high level to the low level. As described, if the input differential voltage Vd1 between the differential input signals INT and INB is small, the differential input circuit 10 will be an unstable circuit that has a small operational margin and is susceptible to noise.

An input/output characteristics test of the differential input circuit 10 is performed under a noise-free environment. For this reason, even in the case of performing the test of the differential input circuit in which the input offset occurs, if the input differential voltage Vd1 between the differential input signals INT and INB is larger than the input voltage offset Voff, the differential input circuit will not be detected as a defective circuit. However, in an actual operating environment, a disturbance due to noise, variation in differential input signal, or the like occurs, and therefore a circuit having a small operational margin often gives rise to a malfunction. Therefore, there are required a test circuit and a test method that can detect a differential input circuit having a small margin, which is likely to malfunction due to an input offset.

SUMMARY

The present invention seeks to solve one or more of the above problems, or to improve upon those problems at least in part. In one embodiment, a test circuit includes a signal level modifying circuit configured to modify at least one of signal levels of an inverting input signal and a noninverting input signal supplied to a differential input circuit in response to a test signal outputted from a signal output circuit to make a difference between signal levels of the inverting input signal and the noninverting input signal smaller than that in a normal operation, wherein the test signal indicates a test mode in which input/output characteristics of the differential input circuit is tested.

In another embodiment, a test method includes: changing a normal operation mode to a test mode in which input/output characteristics of a differential input circuit is tested; modifying at least one of signal levels of an inverting input signal and a noninverting input signal supplied to the differential input circuit in the test mode to make a difference between signal levels of the inverting input signal and the noninverting input signal smaller than that in the normal operation mode; and comparing an output signal of the differential input circuit with an expected value.

According to the present invention, an operationally unstable differential input circuit having a small operational margin can be detected.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 17 is a diagram illustrating a configuration of a test circuit in a second embodiment;

FIG. 18A is a diagram illustrating an example of a configuration of a pull up B circuit according to the second invention;

FIG. 18B is a diagram illustrating an example of a configuration of a pull up T circuit according to the second invention;

FIG. 26 is a diagram illustrating a configuration of a test circuit in a fourth embodiment;

FIG. 27A is a diagram illustrating an example of a configuration of a switching circuit according to the fourth invention;

FIG. 27B is a diagram illustrating another example of the configuration of the switching circuit according to the fourth invention;

DESCRIPTION OF THE PREFERRED EMBODIMENTS

Figure 1:
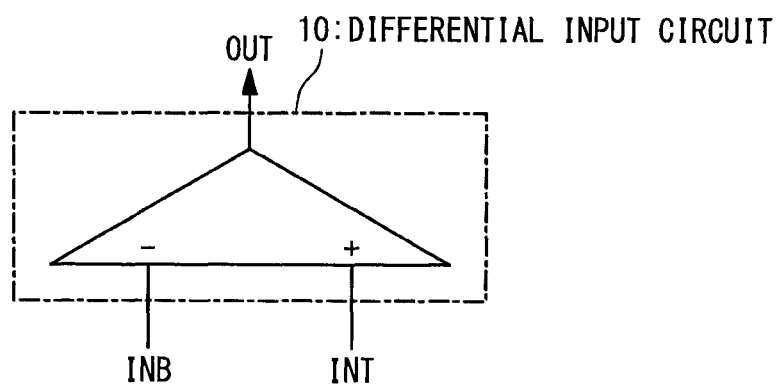
FIG. 1 is a diagram illustrating a symbol of a differential input circuit 10.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will hereinafter be described referring to the accompanying drawings. In the drawings, the same or similar reference symbols indicate the same, similar, or equivalent components.

1. First Embodiment

Referring to FIGS. 11 to 16, a first embodiment of an input/output characteristics test and a test circuit according to the present invention are described, which are applied to the differential input circuit 10.

(Configuration)

Figure 11:
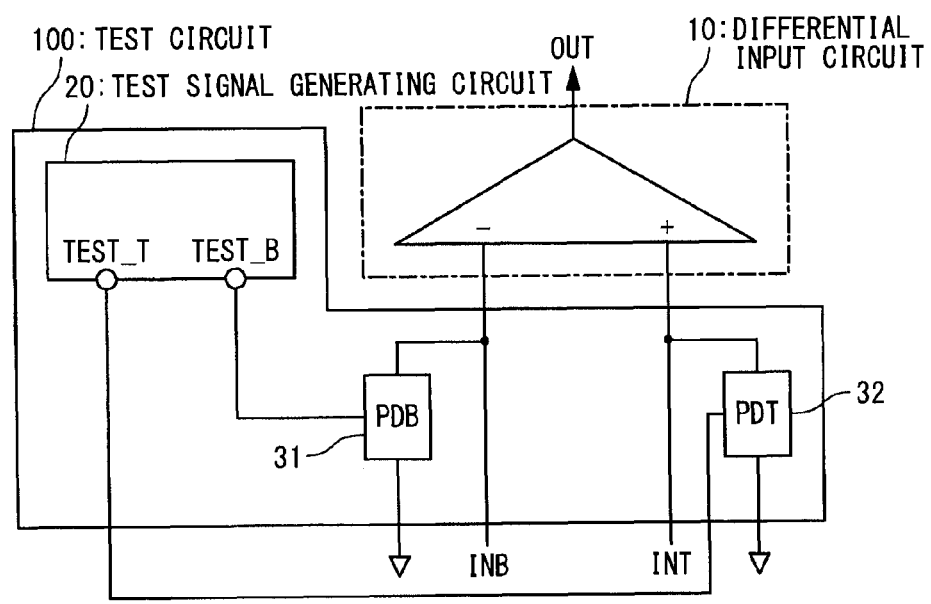
FIG. 11 is a diagram illustrating a configuration of a test circuit in a first embodiment.
Figure 12A:
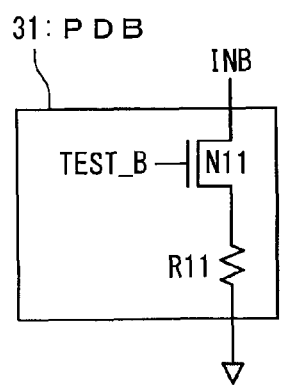
FIG. 12A is a diagram illustrating an example of a configuration of a pull down B circuit according to the first invention.
Figure 12B:
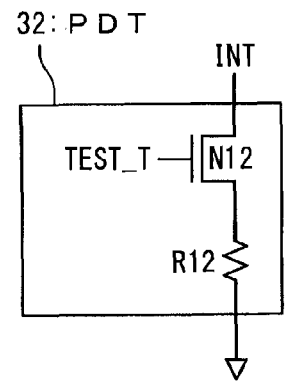
FIG. 12B is a diagram illustrating an example of a configuration of a pull down T circuit according to the first invention.

First, referring to FIGS. 11, 12A and 12B, a configuration of the test circuit in the first embodiment is described. FIG. 11 is a diagram illustrating the configuration of the test circuit in the first embodiment. The test circuit 100 in the first embodiment is connected to the differential input circuit 10, and includes a test signal generating circuit 20, a pull down B circuit 31 (PDB), and a pull down T circuit 32 (PDT). The test signal generating circuit 20 may be provided outside a chip mounted with the differential input circuit 10. In this case, the test signal generating circuit 20 inputs test signals TEST_B and TEST_T to the pull down B circuit 31 and the pull down T circuit 32 respectively through test terminals. Also, the pull down B circuit 31 (PDB) and the pull down T circuit 32 (PDT) are preferably provided within the chip mounted with the differential input circuit 10, but may be provided outside the chip.

Figure 2:
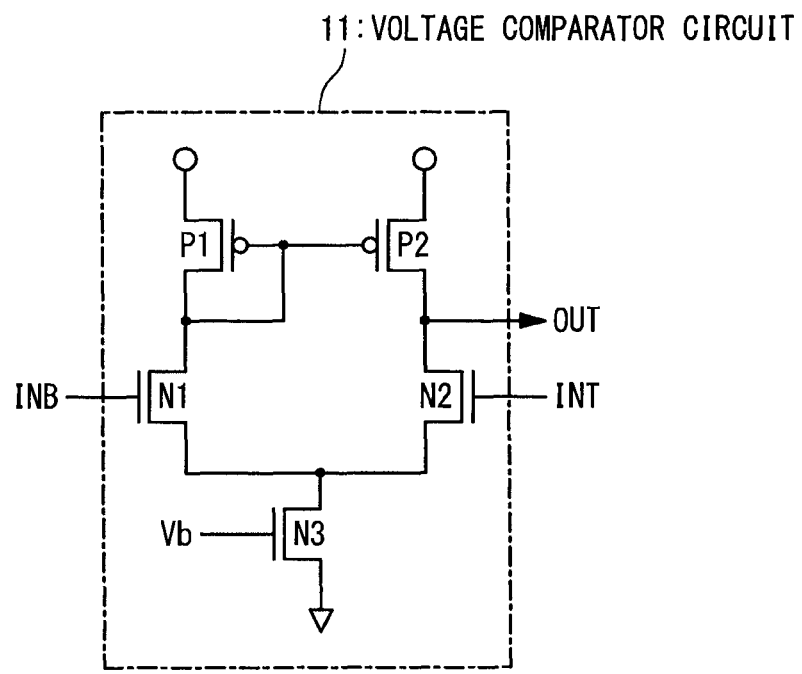
FIG. 2 is a diagram illustrating a configuration of a typical voltage comparator circuit.
Figure 3:
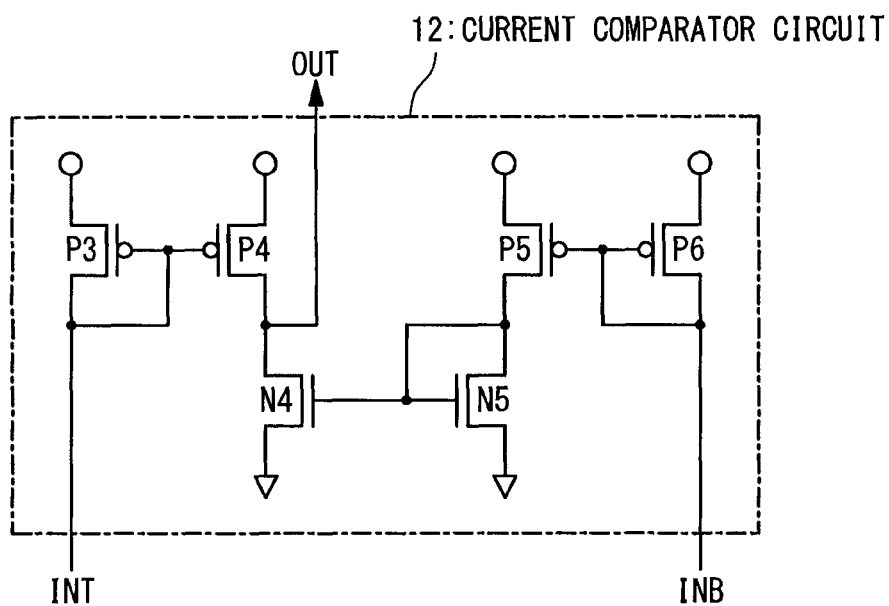
FIG. 3 is a diagram illustrating a configuration of a typical current comparator circuit.

The differential input circuit 10 outputs an output signal OUT having a signal level corresponding to a difference in signal level (voltage or current) between a noninverting input signal INT and an inverting input signal INB that are in a complementary (reverse phase) relationship with each other. In the following, when the noninverting input signal INT and the inverting input signal INB are collectively referred to, they are referred to as differential input signals INT and INB. Also, a voltage difference between them, and a current difference between them are respectively referred to as an input differential voltage and an input differential current. The differential input circuit 10 is exemplified by the voltage comparator circuit 11 illustrated in FIG. 2 or the current comparator circuit 12 illustrated in FIG. 3. For example, the differential input circuit 10 is preferably utilized as an amplifier that drives a bit line pair connected to a memory. The output signal OUT is detected by, for example, a detection circuit (not shown). The detection circuit is provided within the chip mounted with the differential input circuit 10, for example, but may be provided outside the chip.

The pull down B circuit 31 is connected to an input terminal supplied with the inverting input signal INB, and changes the signal level of the inverting input signal INB based on the test signal TEST_B from the test signal generating circuit 20. The pull down T circuit 32 is connected to an input terminal supplied with the noninverting input signal INT, and changes the signal level of the noninverting input signal INT based on the test signal TEST_T from the test signal generating circuit 20.

Referring to FIGS. 12A and 12B, examples of configurations of the pull down B circuit 31 and the pull down T circuit 32 are described. FIG. 12A is a diagram illustrating the example of the configuration of the pull down B circuit 31 according to the present invention. FIG. 12B is a diagram illustrating the example of the configuration of the pull down T circuit according to the present invention.

Referring to FIG. 12A, the pull down B circuit 31 includes an NMOS transistor N11 of which a source is connected to GND through a resistor R11, a drain is connected to the inverting input signal INB, and a gate is supplied with the test signal TEST_B. Referring to FIG. 12B, the pull down T circuit 32 includes an NMOS transistor N12 of which a source is connected to the GND through a resistor R12, a drain is connected to the noninverting input signal INT, and a gate is supplied with the test signal TEST_T.

The test circuit 100 in the present embodiment pulls down one of voltage levels of the inverting input signal INB and the noninverting input signal INT to a predetermined value (Vdw in this case) through the pull down B circuit 31 and the pull down T circuit 32 to thereby intentionally reduce an operational margin of the differential input circuit 10. This enables a differential input circuit having a small operational margin to be detected, which could not be conventionally detected as a defective circuit.

(Operation)

Figure 13:
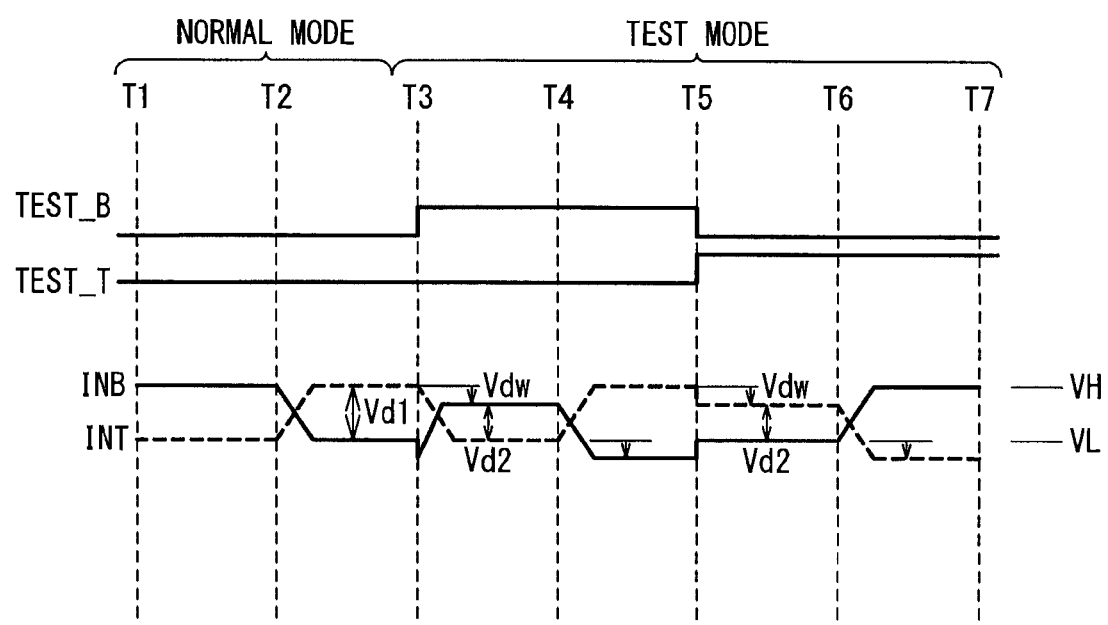
FIG. 13 is a timing chart illustrating signal levels of differential input signals in normal and test modes in the first embodiment.

Referring to FIGS. 13 to 16, details of an operation of the input/output characteristics test for the differential input circuit in the first embodiment are described. FIG. 13 is a timing chart illustrating the signal levels of the differential input signals INT and INB in normal and test modes in the first embodiment.

Referring to FIG. 13, in the normal mode (time T1 to T3 in this case), the test signal generating circuit 20 outputs the test signals TEST_B and TEST_T both having a low level. The NMOS transistors N11 and N12 are brought into an off state based on the low level test signals TEST_B and TEST_T, and therefore the differential input signals INT and INB are inputted to the differential input circuit 10 without the signal levels thereof being changed. Based on this, the differential input circuit 10 performs a normal operation. Given here that high level voltages (signal levels) of the differential input signals INT and INB in the normal operation mode are denoted by VH, and low level voltages (signal levels) of the differential input signals INT and INB in the normal operation mode are denoted by VL. An input differential voltage Vd1 between the differential input signals INT and INB is up to (VH−VL). Note that we here define an absolute value of a voltage difference between the noninverting input signal INT and the inverting input signal INB as the input differential voltage Vd1.

Next, an operation in the test mode (time T3 to T7 in this case) is described. In the present embodiment, any one of the signal levels of the inverting input signal INB and the noninverting input signal INT is controlled. In this example, during a time period T3 to T5, the signal level of the inverting input signal INB is controlled, and during a time period T5 to T7, the signal level of the noninverting input signal INT is controlled.

During the time period T3 to T5, the test signal generating circuit 20 outputs the high level test signal TEST_B and low level test signal TEST_T. The NMOS transistor N11 is turned on in response to the high level test signal TEST_B, and therefore the pull down B circuit 31 pulls down the signal level (voltage) of the inverting input signal INB by the voltage Vdw determined by the resistor R11. Based on this, the high level voltage of the inverting input signal INB is pulled down from VH by Vdw (time T3 to T4), and the low level voltage is pulled down from VL by Vdw (time T4 to T5). On the other hand, the NMOS transistor N12 is turned off based on the low level test signal TEST_T, and therefore the signal level (voltage) of the noninverting input signal INT is brought to the same signal level as that in the normal mode.

From the above, the input differential voltage Vd2 (absolute value) between the differential input signals INT and INB during the time period T3 to T4 becomes smaller than the input differential voltage Vd1 in the normal mode by Vdw.

Similarly, during the time period T5 to T7, the test signal generating circuit 20 outputs the low level test signal TEST_B and the high level test signal TEST_T. The NMOS transistor N11 is turned off based on the low level test signal TEST_B, and therefore the signal level (voltage) of the inverting input signal INB is brought to the same signal level as that in the normal mode. On the other hand, the NMOS transistor N12 is turned on in response to the high level test signal TEST_T, and therefore the pull down T circuit 32 pulls down the signal level (voltage) of the noninverting input signal INT by the voltage Vdw determined by the resistor R12. Based on this, the high level voltage of the noninverting input signal INT is pulled down from VH by Vdw (time T5 to T6), and the low level voltage is pulled down from VL by Vdw (time T6 to T7).

From the above, the input differential voltage Vd2 between the differential input signals INT and INB during the time period T5 to T6 becomes smaller than the input differential voltage Vd1 in the normal mode by Vdw.

In the present embodiment, the input differential voltage Vd2 between the differential input signals INT and INB in the test mode is made smaller than the input differential voltage Vd1 in the normal operation mode by the voltage Vdw to thereby forcedly reduce the operational margin. This enables a differential input circuit having a small operational margin to be detected as a defective circuit.

Figure 14:
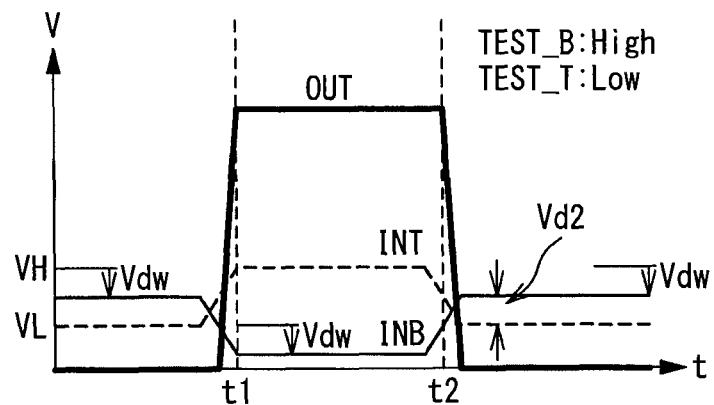
FIG. 14 is a diagram illustrating a test result in the first embodiment for the case where the normal differential input signals are inputted to a normal differential input circuit.
Figure 15:
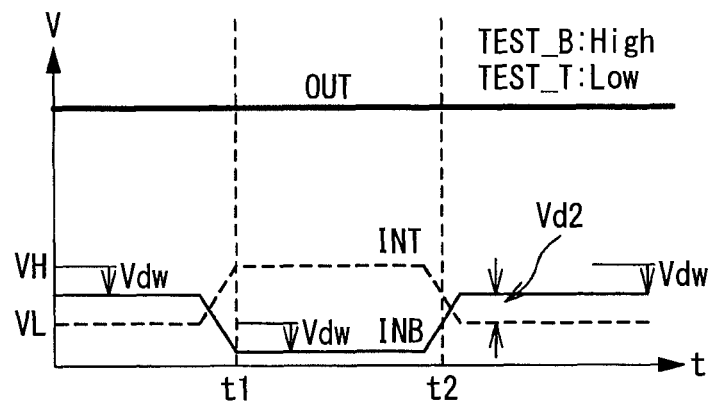
FIG. 15 is a diagram illustrating a test result in the first embodiment for the case where the normal differential input signals are inputted to the differential input circuit in which the input voltage offset occurs.

Referring to FIGS. 14 and 15, a test result (input/output characteristics) in the first embodiment is described in the case where the normal differential input signals INT and INB are inputted to the differential input circuit 10. Here, as an example, an operation is described in the case where the test is performed with the signal level of the inverting input signal INB being varied. That is, in the present test mode, the high level test signal TEST_B and the low level test signal TEST_T are inputted.

Figure 4:
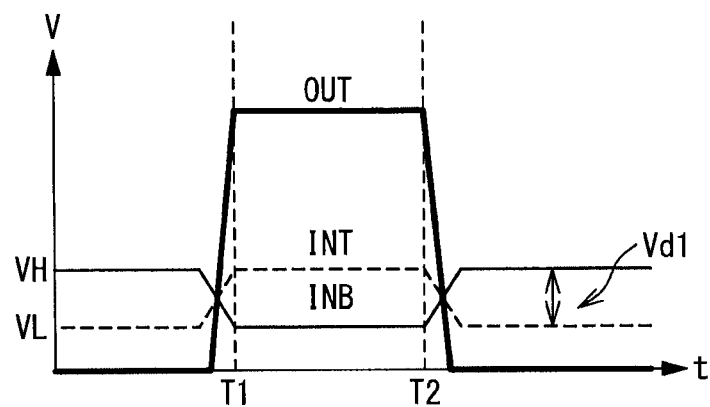
FIG. 4 is a diagram illustrating input/output characteristics for the case where normal differential input signals are inputted to a normal voltage comparator circuit.
Figure 5:
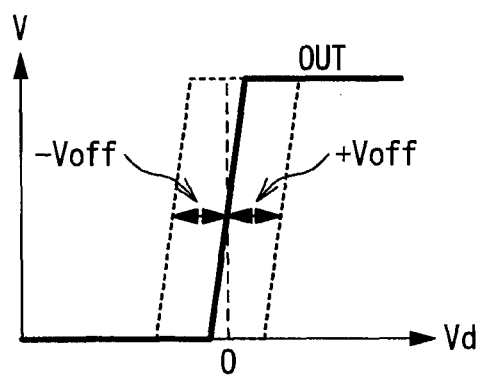
FIG. 5 is a diagram illustrating the input/output characteristics that takes into account an input voltage offset in the voltage comparator circuit.
Figure 6:
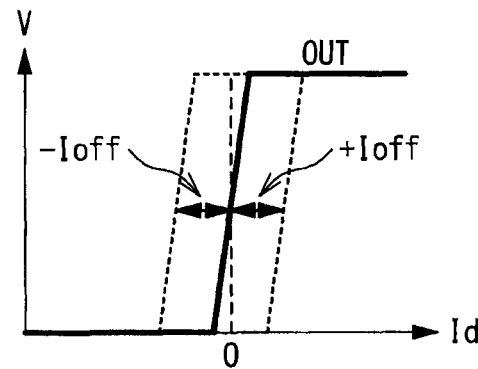
FIG. 6 is a diagram illustrating the input/output characteristics that takes into account an input current offset in the current comparator circuit.
Figure 7:
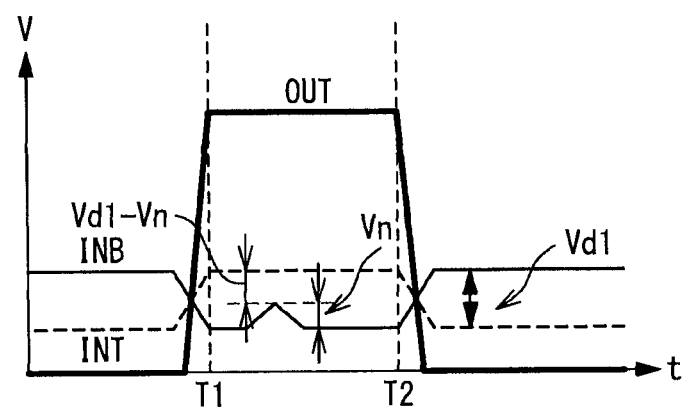
FIG. 7 is a diagram illustrating the input/output characteristics of the normal differential input circuit that outputs an expected value even if noise having an allowable level is mixed.
Figure 8:
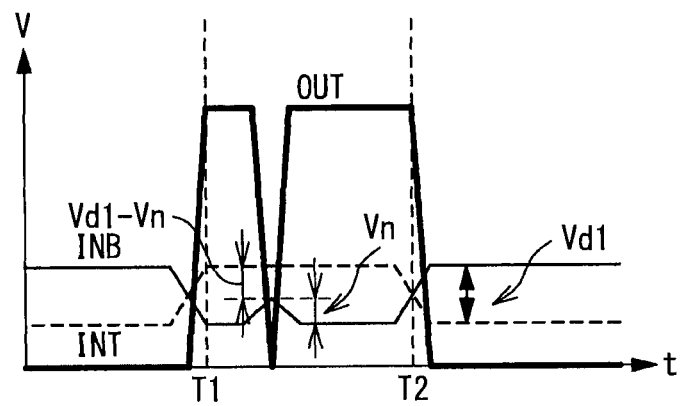
FIG. 8 is a diagram illustrating the input/output characteristics of the differential input circuit that outputs a signal different from the expected value if the noise having the allowable level is mixed.
Figure 16:
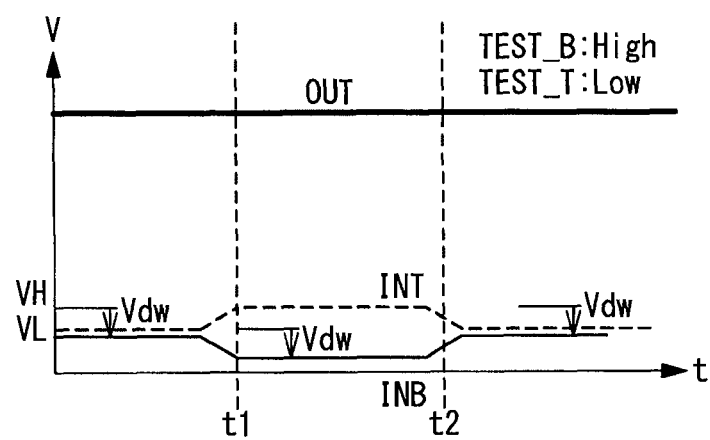
FIG. 16 is a diagram illustrating a test result in the first embodiment for the case where the differential input signals between which an input differential voltage is abnormal are inputted to the differential input circuit.

FIG. 14 is a diagram illustrating the test result in the first embodiment for the case where the normal differential input signals INT and INB are inputted to the normal differential input circuit 10. We here assume that the same differential input signals INT and INB as those illustrated in FIG. 4 are outputted from an unillustrated external circuit. For this reason, in the normal mode, the same output signal OUT as that illustrated in FIG. 4 is outputted as an expected value. In FIGS. 14 to 16, for example, each of time periods before time t1 and after time t2 corresponds to the time period of T3 to T4 in the test mode of FIG. 13, and a time period from time t1 to time t2 corresponds to the time period of T4 to T5 in the test mode of FIG. 13.

Referring to FIG. 14, in the test mode, the pull down B circuit 31 decreases the signal level of the inverting input signal INB by the voltage Vdw. The normal differential input circuit 10 has no input voltage offset Voff, or a very small input voltage offset Voff. For this reason, an effective input differential voltage during a time period (before time t1, and after time t2) in which the inverting input signal INB is decreased from the high level VH by the voltage Vdw is Vd2 (=Vd1−Vdw), and the effective input differential voltage during a time period (time t1 to t2) in which the inverting input signal INB is decreased from the low level VL by the voltage Vdw is (Vd1+Vdw). Note that, because Vd1>Vd2>0, the effective input differential voltage between the differential input signals INT and INB is larger than 0 over the entire time period. Accordingly, in the case of the normal differential input circuit 10, inversion in voltage level between the inverting input signal INB and the noninverting input signal INT does not occur, and therefore the signal level of the output OUT keeps the expected value in the normal operation mode.

FIG. 15 is a diagram illustrating the test result in the first embodiment for the case where the normal differential input signals INT and INB are inputted to the differential input circuit 10 in which the input voltage offset occurs. We here assume that the same differential input signals INT and INB as those illustrated in FIG. 4 are outputted from an unillustrated external circuit. For this reason, in the normal mode, the same output signal OUT as that illustrated in FIG. 4 is outputted as an expected value.

Referring to FIG. 15, in the test mode, the pull down B circuit 31 decreases the signal level of the inverting input signal INB by the voltage Vdw. In the case of the differential input circuit 10 in which the input voltage offset Voff occurs, the effective input differential voltage during a time period (before time t1 and after time t2) in which the inverting input signal INB is decreased from the high level VH by the voltage Vdw is (Vd2−Voff) (=Vd1−Vdw−Voff), and the effective input differential voltage during a time period (time t1 to t2) in which the inverting input signal INB is decreased from the low level VL by the voltage Vdw is (Vd1+Vdw−Voff). Note that if the input voltage offset Voff is larger than the input differential voltage Vd2 (i.e., Vd2−Voff<0), the effective signal levels of the inverting input signal and the noninverting input signal are inverted. In this case, as illustrated in FIG. 15, the signal level of the output signal OUT before the time t1 and after the time t2 are inverted from the low level which is the expected value, to the high level. According to the present invention, the differential input circuit 10 that cannot obtain the output signal OUT having the desired signal level (expected value) as described can be detected as a defective circuit (operationally unstable circuit).

In the present invention, the test is performed under the condition that the input differential voltage Vd2 between the differential input signals INT and INB is made smaller than the input differential voltage Vd1 in the normal operation mode through the pull down B circuit 31 and the pull down T circuit 32 to thereby forcedly reduce the operational margin of the differential input circuit 10. That is, in the present invention, the test is performed with the effective signal levels of the inverting input signal and the noninverting input signal being made more easily invertible than in the normal operation mode. This enables the operationally unstable differential input circuit having the reduced operational margin due to the input voltage offset to be detected as a defective circuit.

Referring to FIG. 16, the test result (input/output characteristics) in the first embodiment is described in the case where the differential input signals INT and INB in which the input differential voltage therebetween is decreased are inputted to the differential input circuit 10. Here, as an example, an operation is described in the case where the test is performed with the signal level of the inverting input signal INB being varied. That is, in the present test mode, the high level test signal TEST_B and the low level test signal TEST_T are inputted.

Figure 9:
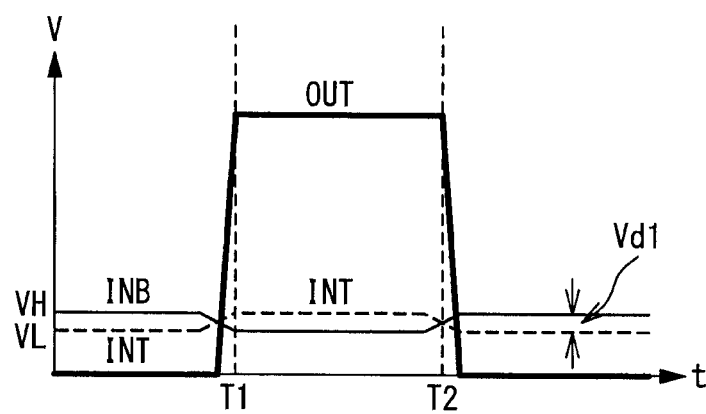
FIG. 9 is a diagram illustrating the input/output characteristics of the normal differential input circuit when the differential input signals exhibiting abnormal values within an allowable range are inputted.
Figure 10:
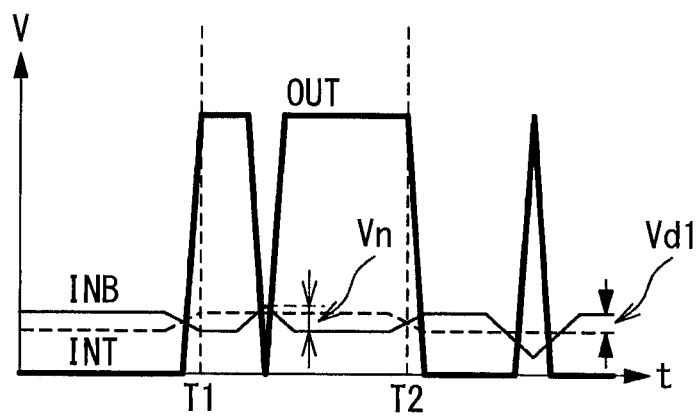
FIG. 10 is a diagram illustrating the input/output characteristics of the differential input circuit that outputs a signal different from the expected value upon input of the differential input signals exhibiting the abnormal values within the allowable range.

FIG. 16 is a diagram illustrating the test result in the first embodiment for the case where the differential input signals INT and INB in which the input differential voltage therebetween is abnormal are inputted to the differential input circuit 10. We here assume that the same differential input signals INT and INB as those illustrated in FIG. 9 are outputted from an unillustrated external circuit. For this reason, in the normal mode, the same output signal OUT as that illustrated in FIG. 9 is outputted as an expected value.

Referring to FIG. 16, in the test mode, the pull down B circuit 31 decreases the signal level of the inverting input signal INB by the voltage Vdw. At this time, if the input differential voltage Vd1 between the differential input signals INT and INB is smaller than the voltage Vdw, the inverting input signal INB having the high level VH is brought to a lower signal level than the low level noninverting input signal INT. In this case, the signal level of the output signal OUT is inverted from the high level, which should have been outputted, to the low level, and therefore the differential input circuit can be detected as a defective circuit.

The differential input circuit in which the input voltage offset Voff smaller than the input differential voltage Vd1 occurs has not been conventionally detected as a defective circuit. However, in the case of the input voltage offset Voff close to the input differential voltage Vd1, a malfunction may have occurred due to a small noise or a variation in differential input signal. On the other hand, in the present invention, the test is performed with the input differential voltage Vd2 smaller than the input differential voltage Vd1 in the normal operation mode. By setting the input differential voltage Vd2 smaller than the detection target input voltage offset Voff, a differential input circuit in which the input voltage offset Voff larger than the input differential voltage Vd2 occurs can be detected as a defective circuit. Also, by setting the input differential voltage Vd2 depending on an allowable range of a variation in the differential input signal (allowable range of the input differential voltage), a differential input circuit that malfunctions due to the differential input signal varying within the allowable range can be detected as a defective circuit.

As described above, the test circuit 100 in the first embodiment decreases a signal level of one of the inverting input signal INB and the noninverting input signal INT in the test mode to thereby make the input differential voltage between the differential input signals INT and INB smaller than that in the normal mode. This enables the operational margin of the differential input circuit 10 to be reduced to perform the test. In the present invention, the operational margin of the differential input circuit 10 is reduced to perform the test of the input/output characteristics. Therefore the operationally unstable differential input circuit in which the input voltage offset Voff is smaller than the input differential voltage Vd1 in the normal operation mode and close to a value of Vd1 can be detected as a defective circuit. Also, in the present invention, by changing driving forces of the pull down B circuit 31 and the pull down T circuit 32, the input differential voltage Vd2 can be set to an arbitrary value. This enables a level of the input voltage offset Voff in a detectable defective circuit to be arbitrarily set.

The above example describes the configuration in which the test is performed with the test signals TEST_B and TEST_T being brought to the high and low levels to pull up the inverting input signal INB; however, the test may be performed with the test signals TEST_B and TEST_T being brought to the low and high levels respectively to pull up the noninverting input signal INT.

Also, in the present embodiment, as the differential input circuit 10, the voltage comparator circuit is described as an example; however, even in the case of the current comparator circuit, the operationally unstable differential input circuit 10 can be similarly detected as a defective circuit by changing the input differential current to reduce the operational margin. That is, by replacing the input voltage with the input current to apply the above-described operation to the current comparator circuit, the same operation and effect can be obtained.

2. Second Embodiment

Referring to FIGS. 17 to 22, a second embodiment of the input/output characteristics test and test circuit according to the present invention is described, which are applied to the differential input circuit 10. The test circuit in the second embodiment decreases an input differential voltage between differential input signals INT and INB to reduce an operational margin in a test mode by pulling up one of signal levels of the inverting input signal INB and the noninverting input signal INT.

(Configuration)

First, referring to FIGS. 17, and 18A and 18B, a configuration of the test circuit in the second embodiment is described. FIG. 17 is a diagram illustrating the configuration of the test circuit in the second embodiment. The test circuit 101 in the second embodiment is connected to the differential input circuit 10, and includes a test signal generating circuit 21, a pull up B circuit 41 (PUB), and a pull up T circuit 42 (PUT). The test signal generating circuit 21 may be provided outside a chip mounted with the differential input circuit 10. In this case, the test signal generating circuit 21 inputs test signals TEST_B and TEST_T to the pull up B circuit 41 and the pull up T circuit 42 through test terminals. Also, the pull up B circuit 41 and the pull up T circuit 42 are preferably provided within the chip mounted with the differential input circuit 10, but may be provided outside the chip.

The pull up B circuit 41 is connected to an input terminal supplied with an inverting input signal INB, and changes a signal level of the inverting input signal INB based on the test signal TEST_B from the test signal generating circuit 21. The pull up T circuit 42 is connected to an input terminal supplied with a noninverting input signal INT, and changes a signal level of the noninverting input signal INT based on the test signal TEST_T from the test signal generating circuit 21.

Referring to FIGS. 18A and 18B, examples of configurations of the pull up B circuit 41 and the pull up T circuit 42 are described. FIG. 18B is a diagram illustrating the example of the configuration of the pull up B circuit 41 according to the present invention. FIG. 18B is a diagram illustrating the example of the configuration of the pull up T circuit 42 according to the present invention.

Referring to FIG. 18A, the pull up B circuit 41 includes a PMOS transistor P21 of which a source is connected to a power supply (VDD) through a resistor R21, a drain is connected to the inverting input signal INB, and a gate is supplied with the test signal TEST_B. Referring to FIG. 18B, the pull up T circuit 42 includes a PMOS transistor P22 of which a source is connected to the power supply (VDD) through a resistor R22, a drain is connected to the noninverting input signal INT, and a gate is supplied with the test signal TEST_T.

The test circuit 101 in the present embodiment pulls up one of voltage levels of the inverting input signal INB and the noninverting input signal INT to a predetermined value (Vup in this embodiment) through the pull up B circuit 41 and the pull up T circuit 42 to thereby intentionally reduce an operational margin of the differential input circuit 10. This enables a differential input circuit having a small operational margin to be detected, which could not be conventionally detected as a defective circuit.

(Operation)

Figure 19:
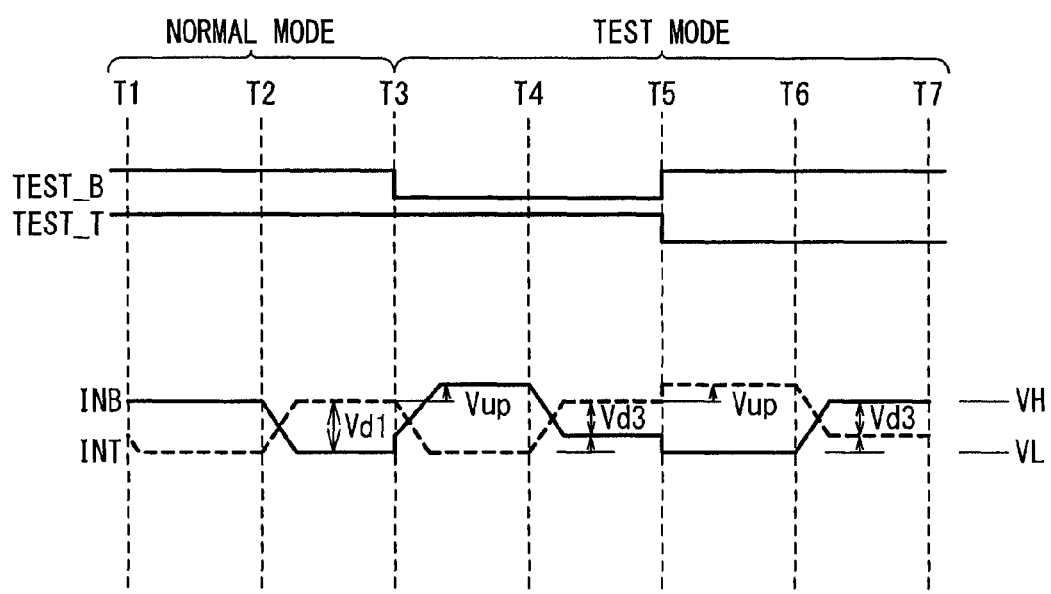
FIG. 19 is a timing chart illustrating signal levels of differential input signals in normal and test modes in the second embodiment.

Referring to FIGS. 19 to 22, operational details of the input/output characteristics test of the differential input circuit in the second embodiment are described. FIG. 19 is a timing chart illustrating the signal levels of the differential input signals INT and INB in normal and test modes in the second embodiment.

Referring to FIG. 19, in the normal mode (time T1 to T3 in this case), the test signal generating circuit 21 outputs the test signals TEST_B and TEST_T both having a high level. The PMOS transistors P21 and P22 are brought into an off state in response to the high level test signals TEST_B and TEST_T, and therefore the signal levels of the differential input signals INT and INB are inputted to the differential input circuit 10 without being changed. Based on this, the differential input circuit 10 performs a normal operation. Given here that high level voltages (signal levels) of the differential input signals INT and INB in the normal operation mode are denoted by VH, and low level voltages (signal levels) by VL, an input differential voltage Vd1 between the differential input signals INT and INB is up to (VH−VL). Note that we here define an absolute value of a voltage difference between the noninverting input signal INT and the inverting input signal INB as the input differential voltage Vd1.

Next, an operation in the test mode (time T3 to T7 in this case) is described. In the present embodiment, any one of the signal levels of the inverting input signal INB and the noninverting input signal INT is controlled. In this example, during a time period T3 to T5, the signal level of the inverting input signal INB is controlled, and during a time period T5 to T7, the signal level of the noninverting input signal INT is controlled.

During the time period T3 to T5, the test signal generating circuit 21 outputs the low level test signal TEST_B and the high level test signal TEST_T. The PMOS transistor P21 is turned in response to the low level test signal TEST_B, and therefore the pull up B circuit 41 pulls up the signal level (voltage) of the inverting input signal INB by a voltage Vup determined by the resistor R21. Based on this, the high level voltage of the inverting input signal INB is pulled up from VH by Vup (time T3 to T4), and the low level voltage is pulled up from VL by Vup (time T4 to T5). On the other hand, the PMOS transistor P22 is turned off based on the high level test signal TEST_T, and therefore the signal level (voltage) of the noninverting input signal INT is brought to a same level as that in the normal mode.

From the above, the input differential voltage Vd3 (absolute value) between the differential input signals INT and INB during the time period T4 to T5 becomes smaller than the input differential voltage Vd1 in the normal mode by Vup.

Similarly, during the time period T5 to T7, the test signal generating circuit 21 outputs the high level test signal TEST_B and the low level test signal TEST_T. The PMOS transistor P21 is turned off based on the high level test signal TEST_B, and therefore the signal level (voltage) of the inverting input signal INB is brought to a same signal level as that in the normal mode. On the other hand, the PMOS transistor P22 is turned on in response to the low level test signal TEST_T, and therefore the pull up T circuit 42 pulls up the signal level (voltage) of the noninverting input signal INT by the voltage Vup determined by the resistor R22. Based on this, the high level voltage of the noninverting input signal INT is pulled up from VH by Vup (time T5 to T6), and the low level voltage is pulled up from VL by Vup (time T6 to T7).

From the above, the input differential voltage Vd3 between the differential input signals INT and INB during the time period T6 to T7 becomes smaller than the input differential voltage Vd1 in the normal mode by Vup.

In the present embodiment, the input differential voltage Vd3 between the differential input signals INT and INB in the test mode is made smaller than that Vd1 in the normal operation mode by the voltage Vup to thereby forcedly reduce the operational margin. This enables a differential input circuit having a small operational margin to be detected as a defective circuit.

Figure 20:
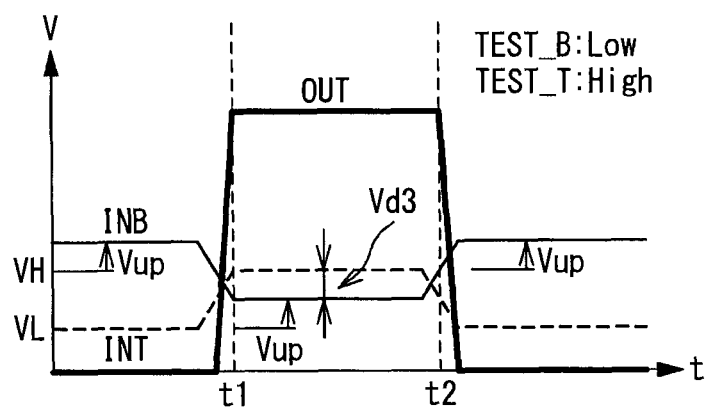
FIG. 20 is a diagram illustrating a test result in the second embodiment for the case where the normal differential input signals are inputted to a normal differential input circuit.
Figure 21:
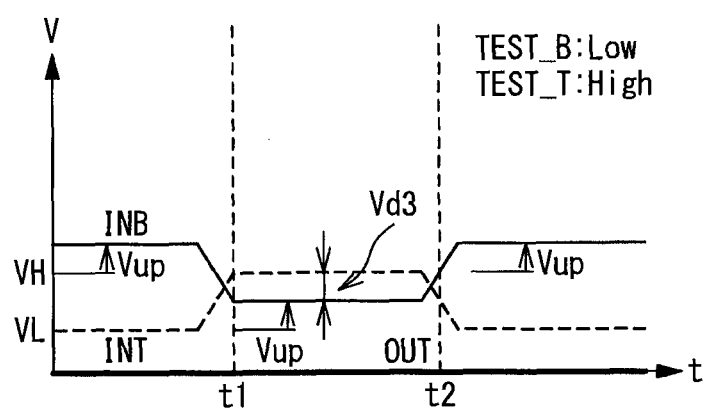
FIG. 21 is a diagram illustrating a test result in the second embodiment for the case where the normal differential input signals are inputted to the differential input circuit in which an input voltage offset occurs.

Referring to FIGS. 20 and 21, a test result (input/output characteristics) in the second embodiment is described in the case where the normal differential input signals INT and INB are inputted to the differential input circuit 10. Here, as an example, an operation is described in the case where the test is performed with the signal level of the inverting input signal INB being varied. That is, in the present test mode, the low level test signal TEST_B and the high level test signal TEST_T are inputted.

Figure 22:
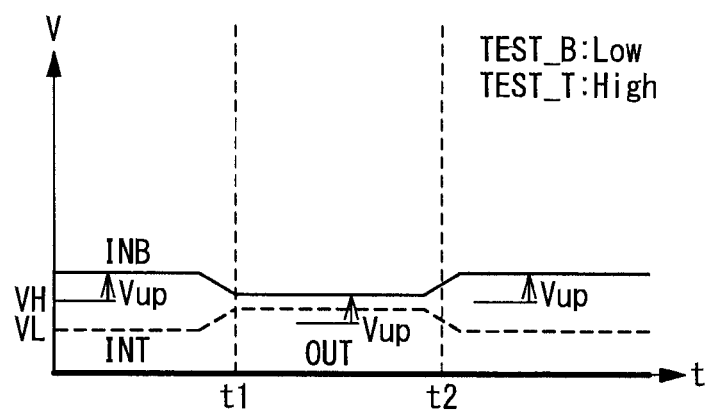
FIG. 22 is a diagram illustrating a test result in the second embodiment for the case where the differential input signals between which an input differential voltage is abnormal are inputted to the differential input circuit.

FIG. 20 is a diagram illustrating the test result in the second embodiment for the case where the normal differential input signals INT and INB are inputted to the normal differential input circuit 10. We here assume that the same differential input signals INT and INB as those illustrated in FIG. 4 are outputted from an unillustrated external circuit. For this reason, in the normal mode, the same output signal OUT as that illustrated in FIG. 4 is outputted as an expected value. In FIGS. 20 to 22, for example, each of time periods before time t1 and after time t2 corresponds to the time period of T3 to T4 in the test mode of FIG. 19, and a time period from time t1 to time t2 corresponds to the time period of T4 to T5 in the test mode of FIG. 19.

Referring to FIG. 20, in the test mode, the pull up B circuit 41 increases the signal level of the inverting input signal INB by the voltage Vup. The normal differential input circuit 10 has no input voltage offset Voff, or a very small input voltage offset Voff. For this reason, an effective input differential voltage during a time period (before time t1, and after time t2) in which the inverting input signal INB is increased from the high level VH by the voltage Vup is (Vd1+Vup), and the effective input differential voltage during a time period (time t1 to t2) in which the inverting input signal INB is increased from the low level VL by the voltage Vup is Vd3 (=Vd1−Vup). Note that, because Vd1>Vd3>0, the effective input differential voltage between the differential input signals INT and INB is larger than 0 over the entire time period. Accordingly, in the case of the normal differential input circuit 10, inversion in voltage level between the inverting input signal INB and the noninverting input signal INT does not occur, and therefore the signal level of the output OUT keeps the expected value in the normal operation mode.

FIG. 21 is a diagram illustrating the test result in the second embodiment for the case where the normal differential input signals INT and INB are inputted to the differential input circuit 10 in which the input voltage offset occurs. We here assume that the same differential input signals INT and INB as those illustrated in FIG. 4 are outputted from an unillustrated external circuit. For this reason, in the normal mode, the same output signal OUT as that illustrated in FIG. 4 is outputted as an expected value.

Referring to FIG. 21, in the test mode, the pull up B circuit 41 increases the signal level of the inverting input signal INB by the voltage Vup. In the case of the differential input circuit 10 in which the input voltage offset Voff occurs, the effective input differential voltage during a time period (before time t1 and after time t2) in which the inverting input signal INB is increased from the high level VH by the voltage Vup is (Vd1+Vup−Voff), and the effective input differential voltage during a time period (time t1 to t2) in which the inverting input signal INB is increased from the low level VL by the voltage Vup is (Vd3−Voff). Note that if the input voltage offset is larger than the input differential voltage Vd3 (i.e., Vd3−Voff<0), the effective signal levels of the inverting input signal and the noninverting input signal are inverted. In this case, as illustrated in FIG. 21, the signal level of the output signal OUT during the time period T1 to T2 is inverted from the high level, which is the expected value, to the low level. According to the present invention, the differential input circuit 10 that cannot obtain the output signal OUT having the desired signal level (expected value) as described can be detected as a defective circuit (operationally unstable circuit).

In the present invention, the test is performed under the condition that the input differential voltage Vd3 between the differential input signals INT and INB is made smaller than the input differential voltage Vd1 in the normal operation mode through the pull up B circuit 41 and the pull up T circuit 42 to thereby forcedly reduce the operational margin of the differential input circuit 10. That is, in the present invention, the test is performed with the effective signal levels of the inverting input signal and the noninverting input signal being made more easily invertible than in the normal operation mode. This enables the operationally unstable differential input circuit having the reduced operational margin due to the input voltage offset to be detected as a defective circuit.

Referring to FIG. 22, the test result (input/output characteristics) in the second embodiment is described in the case where the differential input signals INT and INB between which the input differential voltage is decreased are inputted to the differential input circuit 10. Here, as an example, an operation is described in the case where the test is performed with the signal level of the inverting input signal INB being varied. That is, in the present test mode, the low level test signal TEST_B and the high level test signal TEST_T are inputted.

FIG. 22 is a diagram illustrating the test result in the second embodiment for the case where the differential input signals INT and INB between which the input differential voltage is abnormal are inputted to the differential input circuit 10. We here assume that the same differential input signals INT and INB as those illustrated in FIG. 9 are outputted from an unillustrated external circuit. For this reason, in the normal mode, the same output signal OUT as that illustrated in FIG. 9 is outputted as an expected value.

Referring to FIG. 22, in the test mode, the pull up B circuit 41 increases the signal level of the inverting input signal INB by the voltage Vup. At this time, if the input differential voltage Vd1 between the differential input signals INT and INB is smaller than the voltage Vup, the inverting input signal INB having the low level VL is brought to a higher signal level than the high level noninverting input signal INT. In this case, the signal level of the output signal OUT is inverted from the high level, which is the expected value, to the low level, and therefore the differential input circuit can be detected as a defective circuit.

The differential input circuit in which the input voltage offset Voff smaller than the input differential voltage Vd1 occurs has not been conventionally detected as a defective circuit. However, in the case of the input voltage offset Voff close to the input differential voltage Vd1, a malfunction may have occurred due to small noise or a variation in differential input signal. On the other hand, in the present invention, the test is performed with the input differential voltage Vd3 smaller than the input differential voltage Vd1 in the normal operation mode. By setting the input differential voltage Vd3 smaller than the detection target input voltage offset Voff, the differential input circuit in which the input voltage offset Voff larger than the input differential voltage Vd3 occurs can be detected as a defective circuit. Also, by setting the input differential voltage Vd3 depending on an allowable range of a variation in differential input signal (allowable range of the input differential voltage), a differential input circuit that malfunctions due to the differential input signal varying within the allowable range can be detected as a defective circuit.

As described above, the test circuit 101 in the second embodiment increases a signal level of one of the inverting input signal INB and the noninverting input signal INT in the test mode to thereby make the input differential voltage between the differential input signals INT and INB smaller than that in the normal mode. This enables the operational margin of the differential input circuit 10 to be reduced to perform the test. According to the present invention, the operational margin of the differential input circuit 10 is reduced to perform the test of the input/output characteristics, and therefore the operationally unstable differential input circuit in which the input voltage offset Voff is smaller than the input differential voltage Vd1 in the normal operation mode, and close to a value of Vd1 can be detected as a defective circuit. Also, in the present invention, by changing driving forces of the pull up B circuit 41 and the pull up T circuit 42, the input differential voltage Vd3 can be set to an arbitrary value. This enables a level of the input voltage offset Voff in a detectable defective circuit to be arbitrarily set.

The above example describes the configuration in which the test is performed with the test signals TEST_B and TEST_T being brought to the low level and the high level respectively to pull up the inverting input signal INB; however, the test may be performed with the test signals TEST_B and TEST_T being brought to the high level and the low level respectively to pull up the noninverting input signal INT.

Also, in the present embodiment, as the differential input circuit 10, the voltage comparator circuit is described as an example; however, even in the case of the current comparator circuit, the operationally unstable differential input circuit 10 can be similarly detected as a defective circuit by changing the input differential current to reduce the operational margin. That is, by replacing the input voltage with the input current to apply the above-described operation to the current comparator circuit, the same operation and effect can be obtained.

3. Third Embodiment

Figure 23:
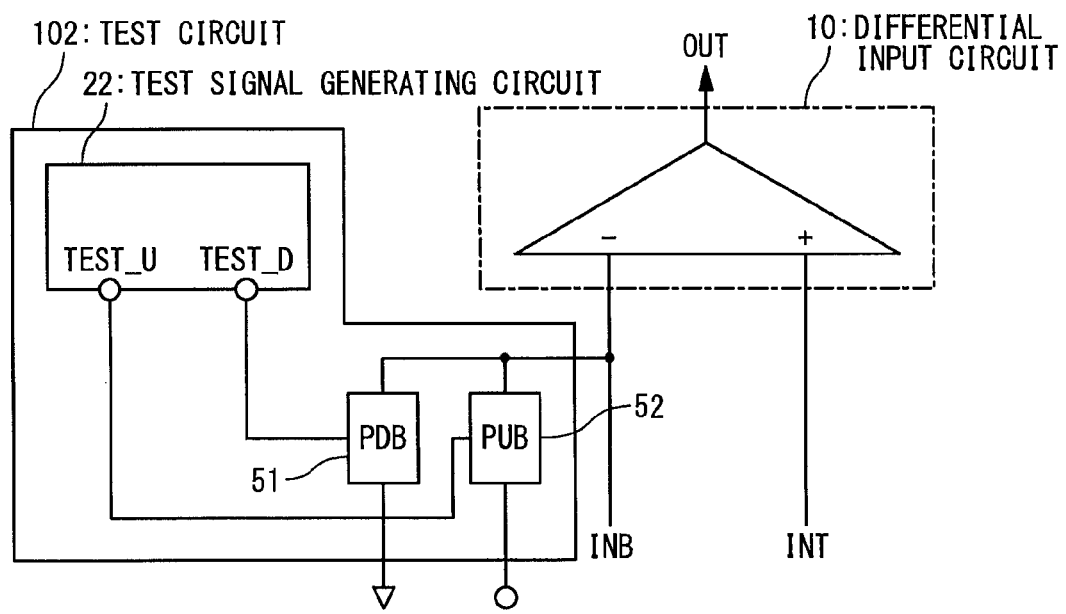
FIG. 23 is a diagram illustrating a configuration of a test circuit in a third embodiment.
Figure 24A:
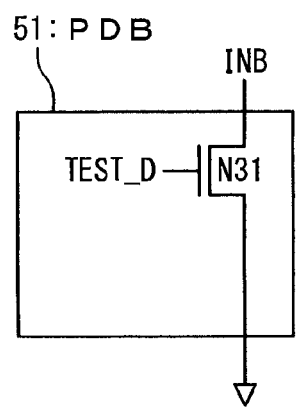
FIG. 24A is a diagram illustrating an example of a configuration of a pull down B circuit according to the third invention.
Figure 24B:
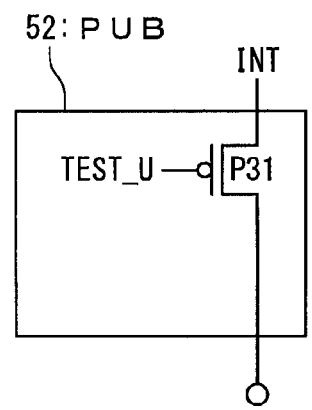
FIG. 24B is a diagram illustrating an example of a configuration of a pull up B circuit according to the third invention.
Figure 25:
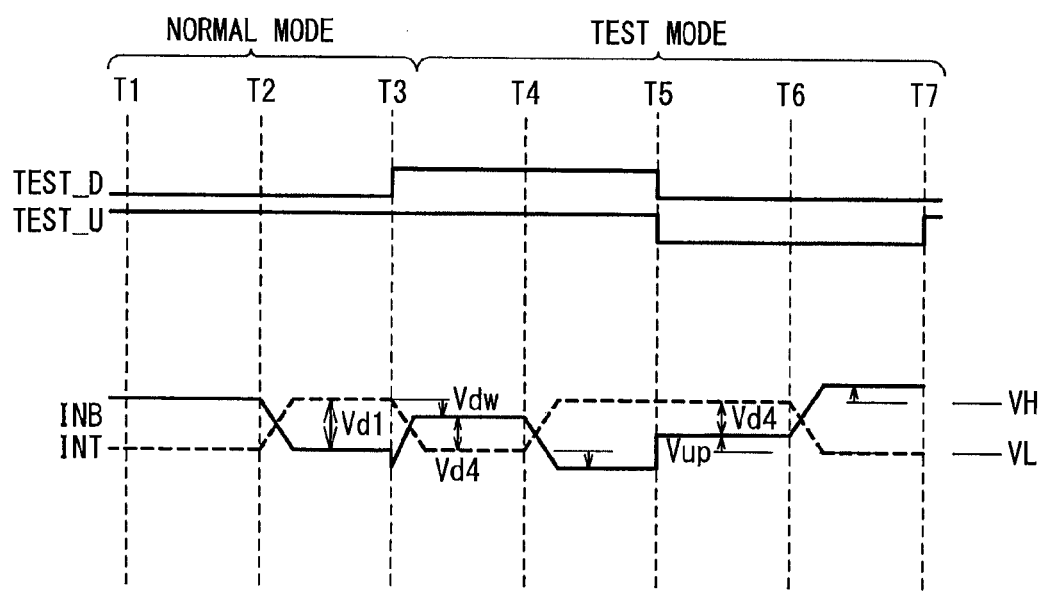
FIG. 25 is a timing chart illustrating signal levels of differential input signals in normal and test modes in the third embodiment.

Referring to FIGS. 23 to 25, a third embodiment of the input/output characteristics test and test circuit according to the present invention is described, which are applied to the differential input circuit 10. The test circuit in the third embodiment decreases an input differential voltage between differential input signals INT and INB to reduce an operational margin in a test mode by varying up or down only one of signal levels of the inverting input signal INB and the noninverting input signal INT.

(Configuration)

First, referring to FIGS. 23, and 24A and 24B, a configuration of the test circuit in the third embodiment is described. FIG. 23 is a diagram illustrating the configuration of the test circuit in the third embodiment. The test circuit 102 in the third embodiment is connected to the differential input circuit 10, and includes a test signal generating circuit 22, a pull down B circuit 51 (PDB), and a pull up B circuit 52 (PUB). The test signal generating circuit 22 may be provided outside a chip mounted with the differential input circuit 10. In such a case, the test signal generating circuit 22 inputs test signals TEST_D and TEST_U to the pull down B circuit 51 and the pull up B circuit 52 respectively through test terminals. Also, the pull down B circuit 51 and the pull up B circuit 52 are preferably provided within the chip mounted with the differential input circuit 10, but may be provided outside the chip.

The pull down B circuit 51 is connected to an input terminal supplied with the inverting input signal INB, and decreases a signal level of the inverting input signal INB based on the test signal TEST_D from the test signal generating circuit 22. The pull up B circuit 52 is connected to the input terminal supplied with the inverting input signal INB, and increases the signal level of the inverting input signal INB based on the test signal TEST_U from the test signal generating circuit 22.

Referring to FIGS. 24A and 24B, examples of configurations of the pull down B circuit 51 and the pull up B circuit 52 are described. FIG. 24A is a diagram illustrating the example of the configuration of the pull down B circuit 51 according to the present invention. FIG. 24B is a diagram illustrating the example of the configuration of the pull up B circuit 52 according to the present invention.

Referring to FIG. 24A, the pull down B circuit 51 includes an NMOS transistor N31 of which a source is connected to GND, a drain is connected to the inverting input signal INB, and a gate is supplied with the test signal TEST_D. Referring to FIG. 24B, the pull up B circuit 52 includes a PMOS transistor P31 of which a source is connected to a power supply (VDD), a drain is connected to the inverting input signal INB, and a gate is supplied with the test signal TEST_U.

The test circuit 102 in the present embodiment pulls up and down a voltage level of the inverting input signal INB to a predetermined value (Vup and Vdw in this case) through the pull down B circuit 51 and the pull up B circuit 52 respectively to thereby intentionally reduce an operational margin of the differential input circuit 10. This enables a differential input circuit having a small operational margin to be detected, which could not be conventionally detected as a defective circuit.

(Operation)

Referring to FIG. 25, operational details of the input/output characteristics test of the differential input circuit in the third embodiment are described. FIG. 25 is a timing chart illustrating the signal levels of the differential input signals INT and INB in normal and test modes in the third embodiment.

Referring to FIG. 25, in the normal mode (time T1 to T3 in this case), the test signal generating circuit 22 outputs the test signals TEST_D and TEST_U respectively having low and high levels. The NMOS transistor N31 is brought into an off state based on the low level test signal TEST_D, and the PMOS transistor P31 is brought into an off state based on the high level test signal TEST_U. Based on this, the signal levels of the differential input signals INT and INB are inputted to the differential input circuit 10 without being changed. Accordingly, in the normal mode, the differential input circuit 10 performs normal operation. Given here that high level voltages (signal levels) of the differential input signals INT and INB in the normal operation mode are denoted by VH, and low level voltages (signal levels) by VL, an input differential voltage Vd1 between the differential input signals INT and INB is up to (VH−VL). Note that we here define an absolute value of a voltage difference between the noninverting input signal INT and the inverting input signal INB as the input differential voltage Vd1.

Next, an operation in the test mode (time T3 to T7 in this case) is described. In the present embodiment, any one of the signal levels of the inverting input signal INB and the noninverting input signal INT is controlled. In this example, during a time period T3 to T5, the signal level of the inverting input signal INB is pulled down (pull down period), and during a time period T5 to T7, the signal level of the inverting input signal INB is pulled up (pull up period).

During the time period T3 to T5, the test signal generating circuit 22 outputs the test signals TEST_D and TEST_U both having the high level. The NMOS transistor N31 is turned on in response to the high level test signal TEST_D, and the PMOS transistor P31 is brought into the off state based on the high level test signal TEST_U. Based on this, the pull down B circuit 51 pulls down the signal level (voltage) of the inverting input signal INB by a voltage Vdw determined by an on-resistance. That is, the high level voltage of the inverting input signal INB is pulled down from VH by Vdw (time T3 to T4), and the low level voltage is pulled down from VL by Vdw (time T4 to T5). On the other hand, the signal level (voltage) of the noninverting input signal INT keeps the same signal level as that in the normal mode.

From the above, the input differential voltage Vd4 (absolute value) between the differential input signals INT and INB during the time period T3 to T4 becomes smaller than the input differential voltage Vd1 in the normal mode by Vdw.

Similarly, during a time period T5 to T7, the test signal generating circuit 22 outputs the test signals TEST_D and TEST_U both having the low level. The NMOS transistor N31 is brought into the off state based on the low level test signal TEST_D, and the PMOS transistor P31 is turned on in response to the low level test signal TEST_U. Based on this, the pull up B circuit 52 pulls up the signal level (voltage) of the inverting input signal INB by a voltage Vup determined by an on-resistance. That is, the low level voltage of the inverting input signal INB is pulled up from VL by Vup (time T5 to T6), and the high level voltage is pulled up from VH by Vup (time T6 to T7). On the other hand, the signal level (voltage) of the noninverting input signal INT keeps the same signal level as that in the normal mode.

From the above, the input differential voltage Vd4 between the differential input signals INT and INB during the time period T5 to T6 becomes smaller than the input differential voltage Vd1 in the normal mode by Vup.

In the present embodiment, the input differential voltage Vd4 between the differential input signals INT and INB in the test mode is made smaller than that Vd1 in the normal operation mode by the voltage Vdw or Vup to thereby forcedly reduce the operational margin. This enables a differential input circuit having a small operational margin to be detected as a defective circuit.

Details of the test operation for the differential input circuit in the third embodiment correspond to the operation combining the operations in the first and second embodiments, and therefore description thereof is omitted.

The test circuit 102 in the present embodiment performs the test with the input differential voltage Vd4 smaller than the input differential voltage Vd1 in the normal operation mode. By setting the input differential voltage Vd4 smaller than the detection target input voltage offset Voff, a differential input circuit in which the input voltage offset Voff larger than the input differential voltage Vd4 occurs can be detected as a defective circuit. Also, by setting the input differential voltage Vd4 depending on an allowable range of a variation in differential input signal (allowable range of the input differential voltage), a differential input circuit that malfunctions due to the differential input signal varying within the allowable range can be detected as a defective circuit.

As described above, the test circuit 102 in the third embodiment increases or decreases a signal level of only one of the inverting input signal INB and the noninverting input signal INT in the test mode to thereby make the input differential voltage between the differential input signals INT and INB smaller than that in the normal mode. This enables the operational margin of the differential input circuit 10 to be reduced to perform the test. According to the present invention, the operational margin of the differential input circuit 10 is reduced to perform the test of the input/output characteristics, and therefore the operationally unstable differential input circuit in which the input voltage offset Voff is smaller than the input differential voltage Vd1 in the normal operation mode and close to a value of Vd1 can be detected as a defective circuit. Also, in the present invention, by changing driving forces of the pull down B circuit 51 and the pull up B circuit 52, the input differential voltage Vd4 can be set to an arbitrary value. This enables a level of the input voltage offset Voff in a detectable defective circuit to be arbitrarily set.

The above describes the example in which the test is performed with only the inverting input signal INB being varied; however, the test may be performed with only the noninverting input signal INT being varied up or down.

Also, in the present embodiment, as the differential input circuit 10, the voltage comparator circuit is described as an example; however, even in the case of the current comparator circuit, the operationally unstable differential input circuit 10 can be similarly detected as a defective circuit by changing the input differential current to reduce the operational margin. That is, by replacing the input voltage with the input current to apply the above-described operation to the current comparator circuit, the same operation and effect can be obtained.

4. Fourth Embodiment

Referring to FIGS. 26 to 29, a fourth embodiment of the input/output characteristics test and test circuit according to the present invention is described, which are applied to the differential input circuit 10. The test circuit in the fourth embodiment decreases an input differential voltage between differential input signals INT and INB to reduce an operational margin in a test mode by varying both signal levels of the inverting input signal INB and the noninverting input signal INT.

(Configuration)

First, referring to FIGS. 26, and 27A and 27B, a configuration of the test circuit in the fourth embodiment is described. FIG. 26 is a diagram illustrating the configuration of the test circuit in the fourth embodiment. The test circuit 103 in the fourth embodiment is connected to the differential input circuit 10, and includes a test signal generating circuit 23 and a switching circuit 60 (SBT). The test signal generating circuit 23 may be provided outside a chip mounted with the differential input circuit 10. In such a case, the test signal generating circuit 23 inputs a test signal TEST_S to the switching circuit 60 through a test terminal. Also, the switching circuit 60 is preferably provided within the chip mounted with the differential input circuit 10, but may be provided outside the chip.

The switching circuit 60 is connected between a signal line supplied with the inverting input signal INB (hereinafter referred to as a signal line INB) and a signal line supplied with the noninverting input signal INT (hereinafter referred to as a signal line INT). The switching circuit 60 controls a connection between the signal lines INB and INT based on the test signal TEST_S from the test signal generating circuit 23.

Referring to FIGS. 27A and 27B, examples of a configuration of the switching circuit 60 are described. FIG. 27A is a diagram illustrating an example of the configuration of the switching circuit 60 according to the present invention. FIG. 27B is a diagram illustrating another example of the configuration of the switching circuit 60 according to the present invention.

Referring to FIG. 27A, the switching circuit 60 includes an NMOS transistor N41 of which a source and drain are connected between the signal lines INB and INT, and a gate is supplied with the test signal TEST_S. Alternatively, referring to FIG. 27B, the switching circuit 60 includes a PMOS transistor P41 of which a source and drain are connected between the signal lines INB and INT, and a gate is supplied with the test signal TEST_S. Both of them are on-off controlled based on a signal level of the test signal TEST_S to control the connection between the signal lines INB and INT. At this time, the input differential voltage between the differential input signals INT and INB is determined by an on-resistance of the transistor inside the switching circuit 60.

The test circuit 103 in the present embodiment decreases the input differential voltage to thereby intentionally reduce an operational margin of the differential input circuit 10 by making the connection between the signal lines INB and INT through the switching circuit 60. This enables a differential input circuit having a small operational margin to be detected, which could not be conventionally detected as a defective circuit.

(Operation)

Figure 28:
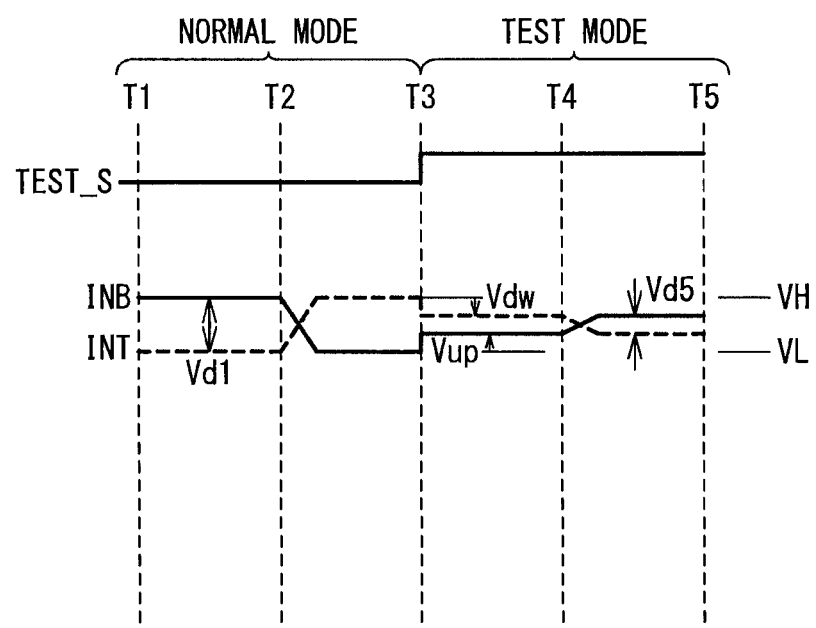
FIG. 28 is a timing chart illustrating signal levels of differential input signals in normal and test modes in the fourth embodiment.
Figure 29:
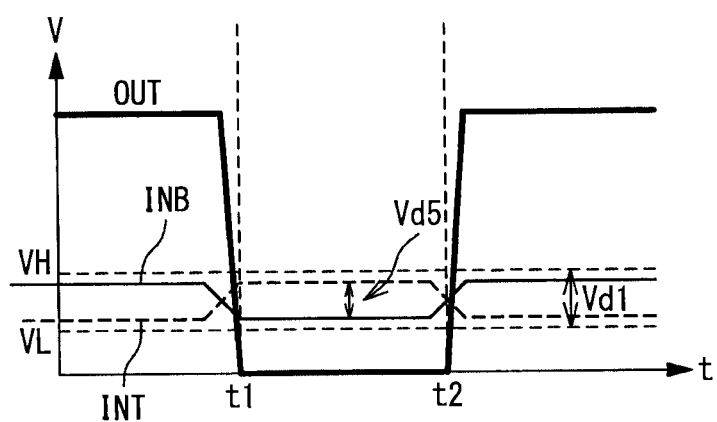
FIG. 29 is a diagram illustrating a test result in the fourth embodiment for the case where the normal differential input signals are inputted to a differential input circuit in which an input voltage offset occurs.

Referring to FIGS. 28 and 29, operational details of the input/output characteristics test of the differential input circuit in the fourth embodiment are described. FIG. 28 is a timing chart illustrating the signal levels of the differential input signals INT and INB in normal and test modes in the fourth embodiment. We here describe a test operation based on the switching circuit 60 using the NMOS transistor illustrated in FIG. 27A.

Referring to FIG. 28, in the normal mode (time T1 to T3 in this case), the test signal generating circuit 23 outputs the test signal TEST_S having a low level. The NMOS transistor N41 is brought into an off state based on the low level test signal TEST_S, and therefore the signal levels of the differential input signals INT and INB are inputted to the differential input circuit 10 without being changed. Based on this, the differential input circuit 10 performs a normal operation. Given here that high level voltages (signal levels) of the differential input signals INT and INB in the normal operation mode are denoted by VH, and low level voltages (signal levels) are denoted by VL, an input differential voltage Vd1 between the differential input signals INT and INB is up to (VH−VL). Note that we here define an absolute value of a voltage difference between the noninverting input signal INT and the inverting input signal INB as the input differential voltage Vd1.

Next, an operation in the test mode (time T3 to T5 in this case) is described. During the time period T3 to T5, the test signal generating circuit 23 outputs the test signal TEST_S having a high level. The NMOS transistor N41 is turned on in response to the high level test signal TEST_S, and the signal lines INB and INT are electrically connected to each other through an on-resistance of the NMOS transistor N41. During a time period T3 to T4, the signal level of the noninverting input signal INT having the high level VH is pulled down by Vdw by the signal line INB having the low level VL, and the signal level of the inverting input signal INB having the low level VL is pulled up by Vup by the signal line INT having the high level VH. Based on this, the input differential voltage between the differential input signals INT and INB becomes Vd5 smaller than Vd1. Similarly, during a time period T4 to T5, the signal level of the inverting input signal INB having the high level VH is pulled down by Vdw by the signal line INT having the low level VL, and the signal level of the noninverting input signal INT having the low level VL is pulled up by Vup by the signal line INB having the high level VH. Based on this, the input differential voltage between the differential input signals INT and INB becomes Vd5 smaller than Vd1.

From the above, the input differential voltage Vd5 (absolute value) between the differential input signals INT and INB during the test mode period (time T3 to T5) becomes smaller than the input differential voltage Vd1 in the normal mode by (Vup+Vdw).

In the present embodiment, the input differential voltage Vd5 between the differential input signals INT and INB in the test mode is made smaller than that Vd1 in the normal operation mode by the voltage (Vup+Vdw) to thereby forcedly reduce the operational margin. This enables a differential input circuit having a small operational margin to be detected as a defective circuit.

Referring to FIG. 29, a test result (input/output characteristics) in the fourth embodiment is described in the case where the normal differential input signals INT and INB are inputted to the differential input circuit 10. FIG. 29 is a diagram illustrating the test result in the fourth embodiment for the case where the normal differential input signals INT and INB are inputted to the differential input circuit 10 in which the input voltage offset occurs. We here assume that the same differential input signals INT and INB as those illustrated in FIG. 4 are outputted from an unillustrated external circuit. For this reason, in the normal mode, the same output signal OUT as that illustrated in FIG. 4 is outputted as an expected value. In FIG. 29, for example, a time period from time t1 to time t2 corresponds to the time period of T3 to T4 in the test mode of FIG. 28, and each of time periods before time t1 and after time t2 corresponds to the time period of T4 to T5 in the test mode of FIG. 28.

Referring to FIG. 29, over the entire time period in the test mode, the input differential voltage between the differential input signals INT and INB is Vd5 smaller than the input differential voltage Vd1 in the normal mode. That is, an effective input differential voltage during the test mode period is (Vd5−Voff). Note that if the input voltage offset is larger than the input differential voltage Vd5 (i.e., Vd5−Voff<0), effective signal levels of the inverting input signal and the noninverting input signals are inverted. In this case, as illustrated in FIG. 29, the output signal OUT takes an inverted value of the expected value over the entire time period. Specifically, a signal level of the output signal OUT before the time t1 and after the time t2 is inverted from the low level, which is the expected value, to the high level. Also, the signal level of the output signal OUT during a time period t1 to t2 is inverted from the high level, which is the expected value, to the low level. As described, in the case of the input voltage offset Voff larger than the input differential voltage Vd5, the signal level of the output signal OUT is brought to a level corresponding to the inverted expected value, and therefore the differential input circuit can be detected as a defective circuit.

In the present invention, the test is performed under the condition that the signal lines INT and INB are electrically connected to each other through the switching circuit 60, and thereby the input differential voltage Vd5 between the differential input signals INT and INB is made smaller than the input differential voltage Vd1 in the normal operation mode to forcedly reduce the operational margin of the differential input circuit 10. That is, in the present invention, the test is performed with the effective signal levels of the inverting input signal and the noninverting input signal being made more easily invertible than in the normal operation mode. This enables the operationally unstable differential input circuit having the reduced operational margin due to the input voltage offset to be detected as a defective circuit.

According to the present invention, the operational margin of the differential input circuit 10 is reduced to perform the test of the input/output characteristics, and therefore the operationally unstable differential input circuit in which the input voltage offset Voff is smaller than the input differential voltage Vd1 in the normal operation mode and close to a value of Vd1 can be detected as a defective circuit. Also, in the present invention, by changing the on-resistance of the switching circuit 60, the input differential voltage Vd5 can be set to an arbitrary value. This enables a level of the input voltage offset Voff in a detectable defective circuit to be arbitrarily set.

The above describes the example in which the NMOS transistor is used as the switching circuit 60; however, even with use of the PMOS transistor illustrated in FIG. 27B, the test can be similarly performed with the input differential voltage being made smaller. In such a case, it should be appreciated that the signal level of the test signal TEST_S is inverted to control the switching operation.

Also, in the present embodiment, as the differential input circuit 10, the voltage comparator circuit is described as an example; however, even in the case of the current comparator circuit, the operationally unstable differential input circuit 10 can be similarly detected as a defective circuit by changing the input differential current to reduce the operational margin. That is, by replacing the input voltage by the input current to apply the above-described operation to the current comparator circuit, the same operation and effect can be obtained.

5. Fifth Embodiment

Referring to FIGS. 30 to 34, a fifth embodiment of the input/output characteristics test and test circuit according to the present invention is described, which are applied to the differential input circuit 10. The test circuit in the fifth embodiment decreases an input differential voltage between differential input signals INT and INB to reduce an operational margin in a test mode by varying both signal levels (current values) of the inverting input signal INB and the noninverting input signal INT.

(Configuration)

Figure 30:
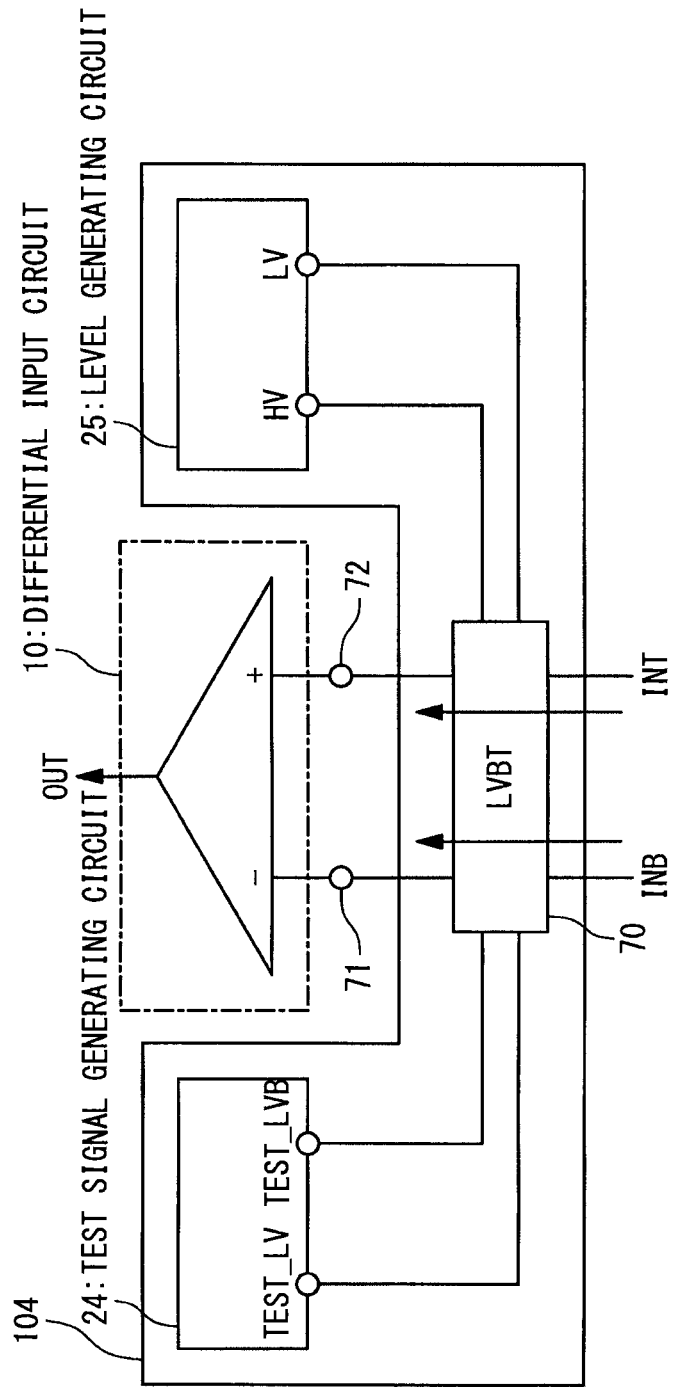
FIG. 30 is a diagram illustrating a configuration of a test circuit in a fifth embodiment.
Figure 31:
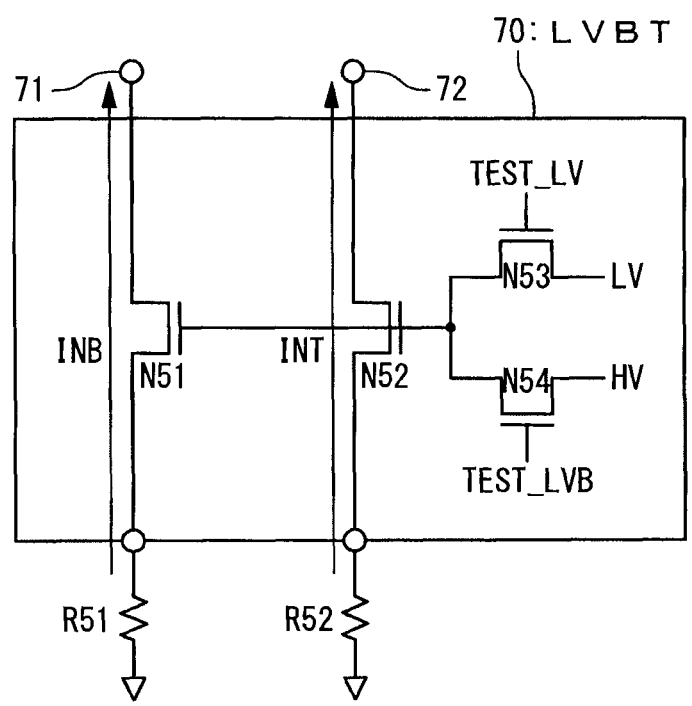
FIG. 31 is a diagram illustrating a configuration of a current control circuit in the embodiment.

First, referring to FIGS. 30 and 31, a configuration of the test circuit in the fifth embodiment is described. FIG. 30 is a diagram illustrating the configuration of the test circuit in the fifth embodiment. The test circuit 104 in the fifth embodiment is connected to the differential input circuit 10, and includes a test signal generating circuit 24, a level generating circuit 25, and a current control circuit 70 (LVBT). The test signal generating circuit 24 and the level generating circuit 25 may be provided outside a chip mounted with the differential input circuit 10. In such a case, the test signal generating circuit 24 inputs test signals TEST_LB and TEST_LT to the current control circuit 70 through test terminals. Similarly, the level generating circuit 25 inputs level signals HV and LV to the current control circuit 70 through test terminals. Also, the current control circuit 70 is preferably provided within the chip mounted with the differential input circuit 10, but may be provided outside the chip.

The level generating circuit 25 outputs the two level signals HV and LV respectively having different signal levels (voltage) to the current control circuit 70. The level signal HV exhibits a constant voltage HV, and the level signal LV exhibits a constant voltage LV. The level generating circuit is configured to be HV>LV.

The current control circuit 70 varies the signal level (current value in this case) of the differential input signal INT or INB in response to a test signal selected by the test signal TEST_LV or TEST_LVB.

FIG. 31 is a diagram illustrating a configuration of the current control circuit 70 in the present embodiment. Referring to FIG. 31, the current control circuit 70 includes NMOS transistors N51, N52, N53, and N54. A source and a drain of the NMOS transistor NB51 are connected between an input terminal 71 on a differential input circuit 10 side, which is supplied with the inverting input signal INB, and a load circuit (resistor R51). The NMOS transistor 51 controls a current amount of the inverting input signal INB based on a level signal inputted to a gate thereof. A source and a drain of the NMOS transistor 52 are connected between an input terminal 72 on the differential input circuit 10 side, which is supplied with the noninverting input signal INT, and a load circuit (resistor 52). The NMOS transistor N52 controls a current amount of the noninverting input signal INT based on a level signal inputted to a gate thereof. Note that the load circuit (resistor R51 or R52) is exemplified by a memory cell.

The NMOS transistor N53 controls electrical connections between a terminal supplied with the level signal LV (hereinafter referred to as a terminal LV) and the gates of the NMOS transistors 51 and 52 based on the test signal TEST_LV. The NMOS transistor N54 controls electrical connections between a terminal supplied with the level signal HV (hereinafter referred to as a terminal HV) and the gates of the NMOS transistors 51 and 52 based on the test signal TEST_LVB.

Here, the NMOS transistors N53 and N54 are deemed as a voltage selecting circuit selecting one of the level signals HV and LV based on the test signals and supplying the selected level signal to the gates of the pair of transistors N51 and N52.

Note that the test signals TEST_LV and TEST_LVB are in a complementary (reverse phase) relationship with each other. For this reason, each of the NMOS transistors N51 and N52 that control the signal levels of the differential input signals INT and INB is supplied with any one of the level signals LV and HV, which is selected by the test signal TEST_LV or LVB.

The test circuit 104 in the present embodiment controls resistance values between the input terminals 71 and 72 and the load circuits (resistors 51 and 52) to vary the signal levels (current values) of the differential input signals INT and INB through the current control circuit 70. This enables the input currents of the differential input signals INT and INB to be decreased to intentionally reduce the operational margin of the differential input circuit 10, and thereby a differential input circuit having a small operational margin to be detected, which could not be conventionally detected as a defective circuit.

(Operation)

Figure 32:
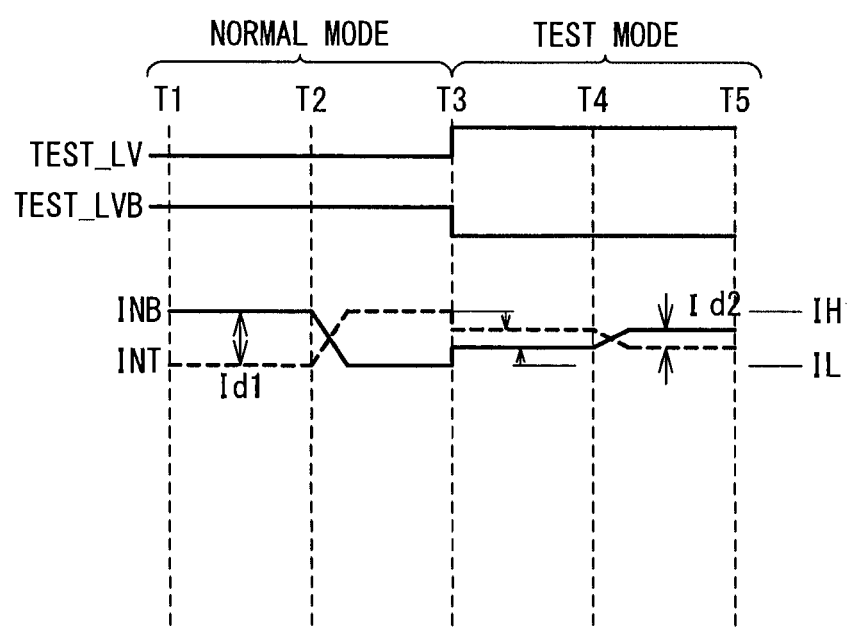
FIG. 32 is a timing chart illustrating signal levels of differential input signals in normal and test modes in the fifth embodiment.
Figure 33:
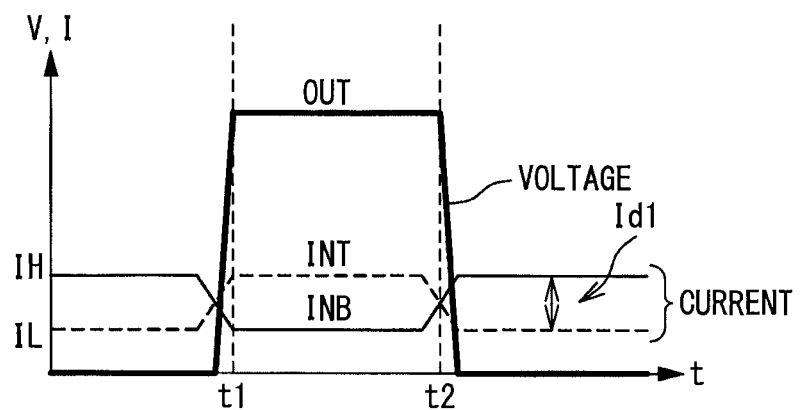
FIG. 33 is a diagram illustrating input/output characteristics for the case where normal differential input signals INT and INB are inputted to a normal current comparator circuit.
Figure 34:
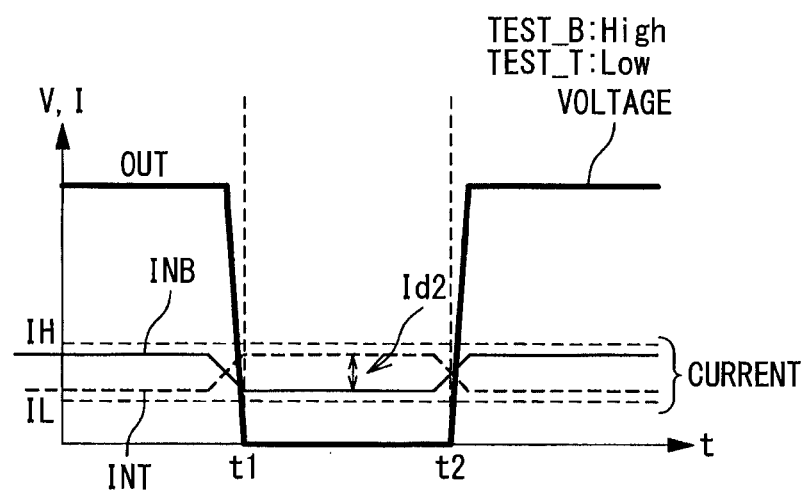
FIG. 34 is a diagram illustrating a test result in the fifth embodiment for the case where the normal differential input signals INT and INB are inputted to a differential input circuit in which an input current offset occurs.

Referring to FIGS. 32 to 34, operational details of the input/output characteristics test of the differential input circuit in the fifth embodiment are described. FIG. 32 is a timing chart illustrating the signal levels of the differential input signals INT and INB in normal and test modes in the fifth embodiment. In the following, an operation for the case where the differential input circuit 10 is a current comparator circuit is described.

Referring to FIG. 32, in the normal mode (time T1 to T3 in this case), the test signal generating circuit 24 outputs the test signal TEST_LV having a low level (test signal TEST_LVB having a high level). Based on this, the NMOS transistors N53 and N54 are turned off and on, respectively, and thereby gates of the NMOS transistors N51 and N52 are supplied with the level signal HV having a high level. The gates of the NMOS transistors 51 and 52 are biased to HV, and thereby the resistors R51 and R52 are respectively applies with a voltage of (VH−VTN) (note that VTN is a threshold voltage of the NMOS transistors N51 and N52). For this reason, a current of (VH−VTN)/R51 flows through the resistor R51, and a current of (VH−VTN)/R52 flows through the resistor R52. That is, a current of the inverting input signal INB is (VH−VTN)/R51, and a current of the noninverting input signal INT is (VH−VTN)/R52.

We here assume that high level signal levels (current values) of the differential input signals INT and INB in the normal operation mode are denoted by IH, and low level signal levels (current values) by IL. During a time period T1 to T2, if the inverting input signal INB is at the high level IH, and the noninverting input signal INT is at the low level IL, i.e., R51<R52, an input differential current Id1 between the differential input signals INT and INB is represented by [(VH−VTN)/R51−(VH−VTN)/R52]. Also, during a time period T2 to T3, if the inverting input signal INB is at the low level IL, and the noninverting input signal INT is at the high level IH, i.e., R52<R51, the input differential current Id1 between the differential input signals INT and INB is represented by [(VH−VTN)/R52−(VH−VTN)/R51].

Next, an operation in the test mode (time T3 to T5 in this case) is described. During the time period T3 to T5, the test signal generating circuit 23 outputs the high level test signal TEST_LV (low level test signal TEST_LVB). Based on this, the NMOS transistors N53 and N54 are turned on and off, respectively, and the gates of the NMOS transistors N51 and N52 are supplied with the level signal LV having the low level. The gates of the NMOS transistors N51 and N52 are biased to LV, and thereby the resistors R51 and R52 are respectively applied with a voltage of (VL−VTN). For this reason, a current of (LL−VTN)/R51 flows through the resistor R51, and a current of (LL−VTN)/R52 flows through the resistor R52. That is, the current of the inverting input signal INB is (LL−VTN)/R51, and that of the noninverting input signal INT is (LL−VTN)/R52.

During a time period T3 to T4, if the inverting input signal INB is at the low level IL, and the noninverting input signal INT is at the High level IH, i.e., during a time period where R52<R51, the input differential current Id2 is [(VL−VTN)/R52−(VL−VTN)/R51]. If we here compare the input differential current Id1 in the normal mode with the input differential current Id2 in the test mode during the time period where R52<R51, a difference between them (Id1−Id2) is [(VH−VL)×(1/R52−1/R51)]. Note that VH>VL, and (1/R52)>(1/R51), and therefore (Id1−Id2)>0. That is, the input differential current Id2 in the test mode is smaller than that Id1 in the normal mode by [(VH−VL)×(1/R52−1/R51)].

If the test mode is set when, during a time period T4 to T5, the inverting input signal INB is at the high level IH, and the noninverting input signal is at the low level IL, i.e., during a time period where R51<R52, the input differential current Id1 is [(VL−VTN)/R51−(VL−VTN)/R52]. Even during the time period, the input differential current Id2 in the test mode is, similarly to the above, smaller than the input differential current Id1 in the normal mode by [(VH−VL)×(1/R51−1/R52)].

From the above, the input differential current between the differential input signals INT and INB in the test mode period (time T3 to T5) is Id2 that is smaller than the input differential current Id1 in the normal mode.

In the present embodiment, the input differential current Id2 between the differential input signals INT and INB in the test mode is made smaller than that Id1 in the normal operation mode to thereby forcedly reduce the operational margin. This enables a differential input circuit having a small operational margin to be detected as a defective circuit.

Referring to FIGS. 33 and 34, a test result (input/output characteristics) in the fifth embodiment is described in the case where the normal differential input signals INT and INB are inputted to the differential input circuit 10. FIG. 33 is a diagram illustrating the input/output characteristics for the case where the normal differential input signals INT and INB are inputted to the normal current comparator circuit 12. Referring to FIG. 33, the differential input circuit 10 outputs the high level output signal OUT when the voltage level of the noninverting input signal INT is higher than that of the inverting input signal INB, and the input differential current is Id1 (time t1 to t2). Also, the differential input circuit 10 outputs the low level output signal OUT when the voltage level of the noninverting input signal INT is lower than that of the inverting input signal INB, and the input differential current is Id1 (before time t1, and after time t2). In FIG. 33, for example, each of the time periods before time t1 and after time t2 corresponds to the time period of T1 to T2 in the normal mode of FIG. 32, and the time period from time t1 to time t2 corresponds to the time period of T2 to T3 in the normal mode of FIG. 32.

FIG. 34 is a diagram illustrating the test result in the fifth embodiment for the case where the normal differential input signals INT and INB are inputted to the differential input circuit 10 in which the input current offset occurs. We here assume that the same differential input signals INT and INB as those illustrated in FIG. 33 are outputted from an unillustrated external circuit. For this reason, in the normal mode, the same output signal OUT as that illustrated in FIG. 33 is outputted as an expected value.

Referring to FIG. 34, over the entire time period in the test mode, the input differential current between the differential input signals INT and INB is Id2 smaller than the input differential current Id1 in the normal mode. That is, an effective input differential current during the test mode period is (Id2−Ioff). Here, Ioff represents the input current offset Ioff occurring in the differential input circuit 10. Note that if the input current offset Ioff is larger than the input differential current Id2 (i.e., Id2−Ioff<0), effective signal levels of the inverting input signal and the noninverting input signal are inverted. In this case, as illustrated in FIG. 34, the output signal OUT takes an inverted value of the expected value over the entire time period. Specifically, the signal level of the output signal OUT before the time t1 and after the time t2 is inverted from the low level, which is the expected value, to the high level. Also, the signal level of the output signal OUT during a time period t1 to t2 is inverted from the high level, which is the expected value, to the low level. As described, in the case of the input current offset Ioff larger than the input differential current Id2 that is decreased by the test circuit 103, the signal level of the output signal OUT is brought to a level corresponding to the inverted expected value, and therefore the differential input circuit can be detected as a defective circuit. In FIG. 34, for example, each of the time periods before time t1 and after time t2 corresponds to the time period of T4 to T5 in the test mode of FIG. 32, and the time period from time t1 to time t2 corresponds to the time period of T3 to T4 in the test mode of FIG. 32.

In the present invention, the test is performed under the condition that amounts of the currents flowing between the input terminals 71 and 72 and the load circuits (resistors R51 and R52) respectively are controlled through the current control circuit 70, and thereby the input differential current between the differential input signals INT and INB is brought to the smaller input differential current Id2 than the input differential current Id1 in the normal operation mode to forcedly reduce the operational margin of the differential input circuit 10. That is, in the present invention, the test is performed with the effective signal levels of the inverting input signal and the noninverting input signal being made more easily invertible than in the normal operation mode. This enables the operationally unstable differential input circuit having the reduced operational margin due to the input current offset to be detected as a defective circuit.

According to the present invention, the operational margin of the differential input circuit 10 is reduced to perform the test of the input/output characteristics, and therefore the operationally unstable differential input circuit in which the input current offset Ioff is smaller than the input differential current Id1 in the normal operation mode and close to a value of Id1 can be detected as a defective circuit. Also, in the present invention, by changing on-resistances in the current control circuit 70, the input differential current Id2 can be set to an arbitrary value. This enables a level of the input current offset Ioff in a detectable defective circuit to be arbitrarily set.

The above describes the example in which the NMOS transistors are used as the current control circuit 70; however, even with use of PMOS transistors, the test can be similarly performed with the input differential current being made smaller. In such a case, it should be appreciated that the signal levels of the test signals TEST_LV and TEST_LVB are inverted to perform the switching operation.

Also, in the present embodiment, as the differential input circuit 10, the current comparator circuit is described as an example; however, even in the case of the voltage comparator circuit, the operationally unstable differential input circuit 10 can be similarly detected as a defective circuit by changing the input differential voltage to reduce the operational margin. That is, by replacing the input current with an input voltage to apply the above-described operation to the voltage comparator circuit, the same operation and effect can be obtained.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A test circuit comprising:
    a signal level modifying circuit configured to modify at least one of signal levels of an inverting input signal and a noninverting input signal supplied to a differential input circuit in response to a test signal outputted from a signal output circuit to make a difference between signal levels of said inverting input signal and said noninverting input signal smaller than that in a normal operation,
    wherein said test signal indicates a test mode in which input/output characteristics of said differential input circuit is tested.

2. The test circuit according to claim 1, wherein said signal level modifying circuit includes:
    a pull down circuit configured to pull down a signal level, which is a high level, of said inverting input signal and said noninverting input signal in said test mode.

3. The test circuit according to claim 1, wherein said signal level modifying circuit includes:
    a pull up circuit configured to pull up a signal level, which is a low level, of said inverting input signal and said noninverting input signal in said test mode.

4. The test circuit according to claim 1, wherein said signal level modifying circuit includes:
- a switching circuit configured to control a connection between a first signal line supplied with said inverting input signal and a second signal line supplied with said noninverting input signal,
- wherein said switching circuit electrically connects said first signal line and said second signal through a resistor in said test mode.

5. The test circuit according to claim 1, wherein said signal level modifying circuit includes:
- a current control circuit configured to make currents of said inverting input signal and said noninverting input signal smaller than those of a normal operation in said test mode.

6. The test circuit according to claim 5, wherein said signal level modifying circuit further includes:
- a level generating circuit configured to supply a first voltage and a second voltage different from said first voltage,
- wherein said current control circuit includes:
- a pair of transistors configured to be connected between a pair of signal lines supplied with said inverting input signal and said noninverting input signal and load circuits respectively, and
- a voltage selecting circuit configured to select one of said first voltage and said second voltage based on said test signal and supply said selected voltage to gates of said pair of transistors.

7. The test circuit according to claim 1, wherein said differential input circuit includes a voltage comparator circuit.

8. The test circuit according to claim 1, wherein said differential input circuit includes a currant comparator circuit.

9. A test method comprising:
- changing a normal operation mode to a test mode in which input/output characteristics of a differential input circuit is tested;
- modifying at least one of signal levels of an inverting input signal and a noninverting input signal supplied to said differential input circuit in said test mode to make a difference between signal levels of said inverting input signal and said noninverting input signal smaller than that in said normal operation mode; and
- comparing an output signal of said differential input circuit with an expected value.

10. The test method according to claim 9, wherein said modifying step includes:
- pulling down a signal level, which is a high level, of said inverting input signal and said noninverting input signal.

11. The test method according to claim 9, wherein said modifying step includes:
- pulling up a signal level, which is a low level, of said inverting input signal and said noninverting input signal.

12. The test method according to claim 9, wherein said modifying step includes:
- connecting electrically a first signal line supplied with said inverting input signal and a second signal line supplied with said noninverting input signal through a resistor.

13. The test method according to claim 9, wherein said modifying step includes:
- making currents of said inverting input signal and said noninverting input signal smaller than those of said normal operation mode.

14. The test circuit according to claim 9, wherein said differential input circuit includes a voltage comparator circuit,
- wherein said modifying step includes:
- making a difference between input voltages of said inverting input signal and said noninverting input signal smaller than that in said normal operation mode.

15. The test circuit according to claim 9, wherein said differential input circuit includes a current comparator circuit,
- wherein said modifying step includes:
- making a difference between input currents of said inverting input signal and said noninverting input signal smaller than that in said normal operation mode.

* * * * *